US010461710B1

(12) United States Patent
Charlton et al.

(10) Patent No.: US 10,461,710 B1
(45) Date of Patent: Oct. 29, 2019

(54) MEDIA PLAYBACK SYSTEM WITH MAXIMUM VOLUME SETTING

(71) Applicant: SONOS, INC., Santa Barbara, CA (US)

(72) Inventors: Frank Charlton, Seattle, WA (US);
Jodi Vautrin, Boston, MA (US);
Robert Lambourne, Santa Barbara, CA (US); Nathan Fish, Ventura, CA (US);
Daniel Casimiro, Mansfield, MA (US);
Won So, Boston, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 16/123,928

(22) Filed: Sep. 6, 2018

Related U.S. Application Data

(60) Provisional application No. 62/723,942, filed on Aug. 28, 2018.

(51) Int. Cl.
*H03G 1/02* (2006.01)
*G06F 3/16* (2006.01)
*H03G 7/00* (2006.01)
*H03G 3/02* (2006.01)
*H03G 5/02* (2006.01)

(52) U.S. Cl.
CPC ............... *H03G 1/02* (2013.01); *G06F 3/165* (2013.01); *H03G 3/02* (2013.01); *H03G 5/02* (2013.01); *H03G 7/00* (2013.01); *H04R 2430/01* (2013.01)

(58) Field of Classification Search
CPC .. H03G 3/20; H03G 3/02; H03G 5/20; H03G 7/00; H03G 5/02; H03G 1/02; H04R 2430/01; G06F 3/165
USPC ................................................. 381/104–109
See application file for complete search history.

(56) References Cited

U.S. PATENT DOCUMENTS

| 5,440,644 | A | 8/1995 | Farinelli et al. |
| 5,761,320 | A | 6/1998 | Farinelli et al. |
| 5,923,902 | A | 7/1999 | Inagaki |
| 6,032,202 | A | 2/2000 | Lea et al. |

(Continued)

FOREIGN PATENT DOCUMENTS

| EP | 1389853 A1 | 2/2004 |
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.

(Continued)

*Primary Examiner* — Disler Paul

(57) ABSTRACT

Disclosed herein are embodiments for adjusting playback volume in a media playback system that utilizes a maximum volume feature. In one embodiment, when a playback device receives an instruction to change its playback volume to a requested volume level, the playback device will not necessarily set its playback volume state variable to the requested volume level, but rather will calculate a new (typically lower) alternate volume level based on the maximum volume state variable and instead set its playback volume state variable to that alternate volume level. Moreover, when a playback device shares certain of its state variables among the other devices of the media playback system, the playback device will not necessarily share its actual playback volume state variable, but rather will calculate a new (typically higher) representative volume level and instead share that representative volume level.

18 Claims, 17 Drawing Sheets

(56) References Cited

U.S. PATENT DOCUMENTS

| | | |
|---|---|---|
| 6,256,554 B1 | 7/2001 | DiLorenzo |
| 6,404,811 B1 | 6/2002 | Cvetko et al. |
| 6,469,633 B1 | 10/2002 | Wachter et al. |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington et al. |
| 8,483,853 B1 | 7/2013 | Lambourne et al. |
| 8,942,252 B2 | 1/2015 | Balassanian et al. |
| 9,270,242 B2* | 2/2016 | Ito .............. H03F 1/52 |
| 10,013,381 B2* | 7/2018 | Mayman .......... G06F 1/1632 |
| 10,216,475 B2* | 2/2019 | Park ............ G06F 3/165 |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty |
| 2004/0024478 A1 | 2/2004 | Hans et al. |
| 2007/0142944 A1 | 6/2007 | Goldberg et al. |
| 2011/0051959 A1* | 3/2011 | Ito .............. H03F 1/52 |
| | | 381/107 |
| 2015/0293744 A1* | 10/2015 | Bae ............ H04N 21/42225 |
| | | 381/105 |
| 2016/0378430 A1* | 12/2016 | McCarthy .......... H03G 3/32 |
| | | 381/57 |
| 2019/0007232 A1* | 1/2019 | Kim ............ H04L 12/28 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

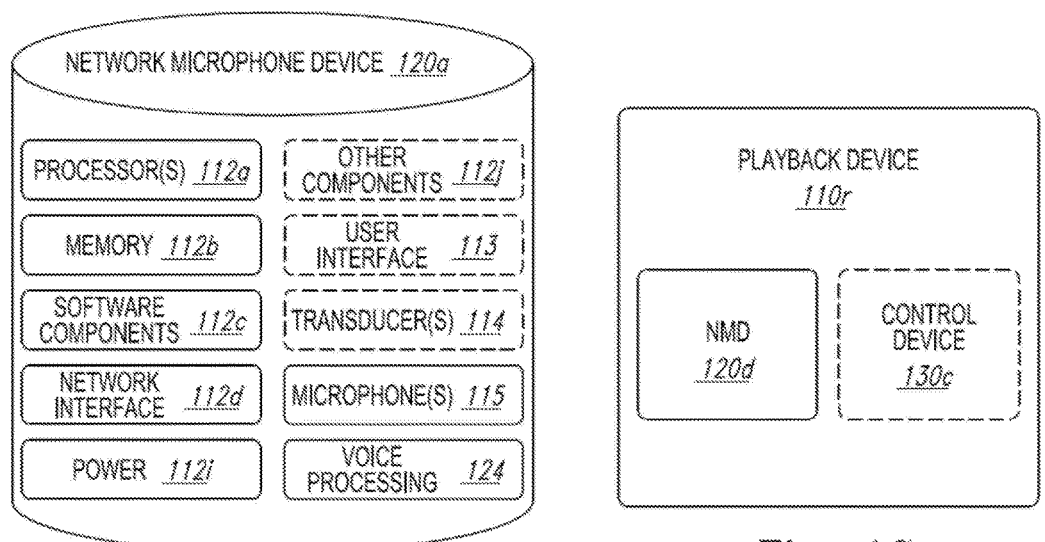
*Fig. 1F*
*Fig. 1G*
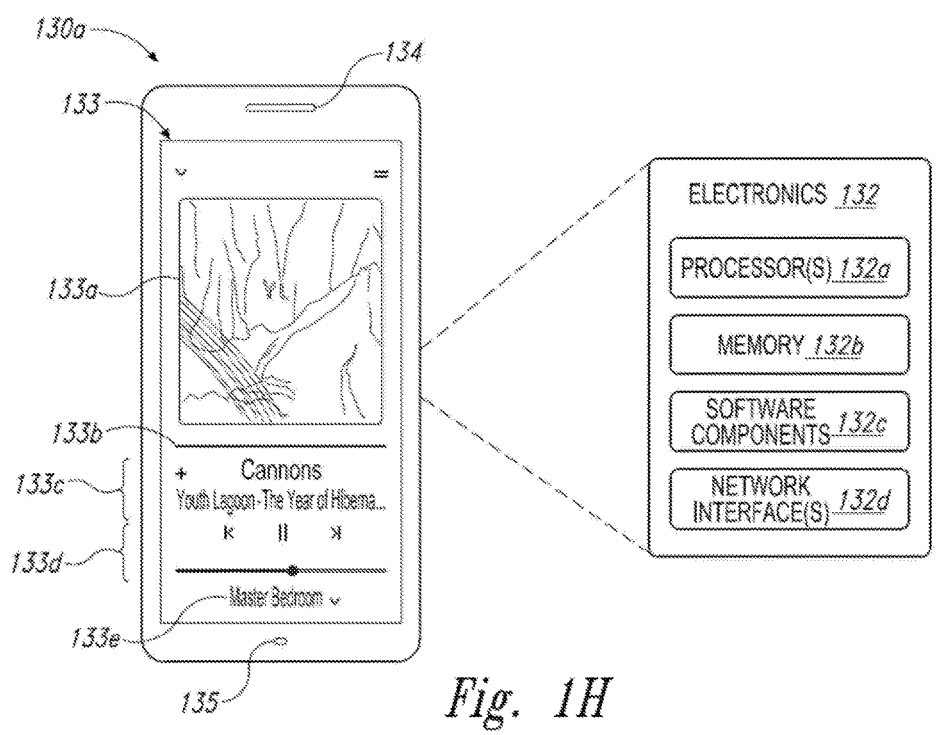
*Fig. 1H*

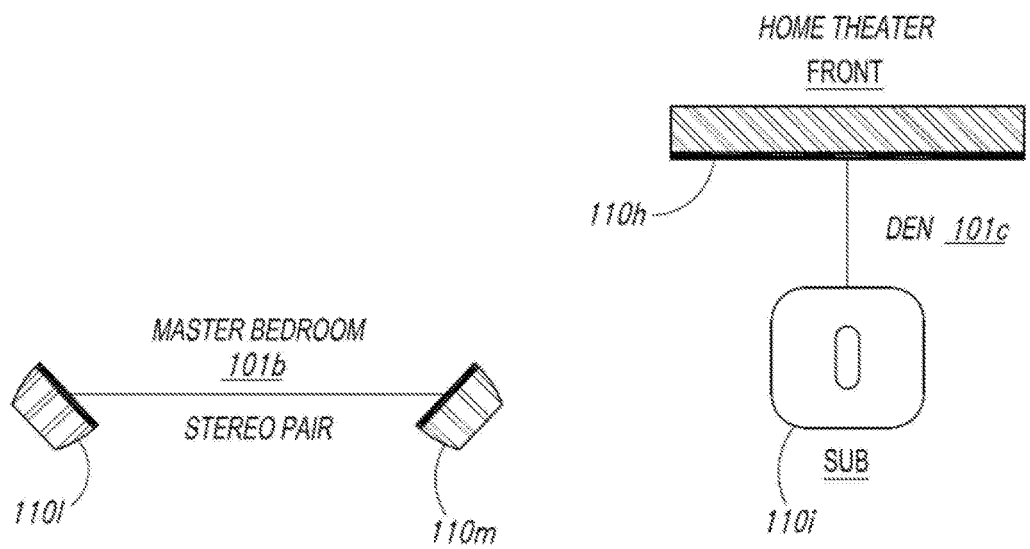
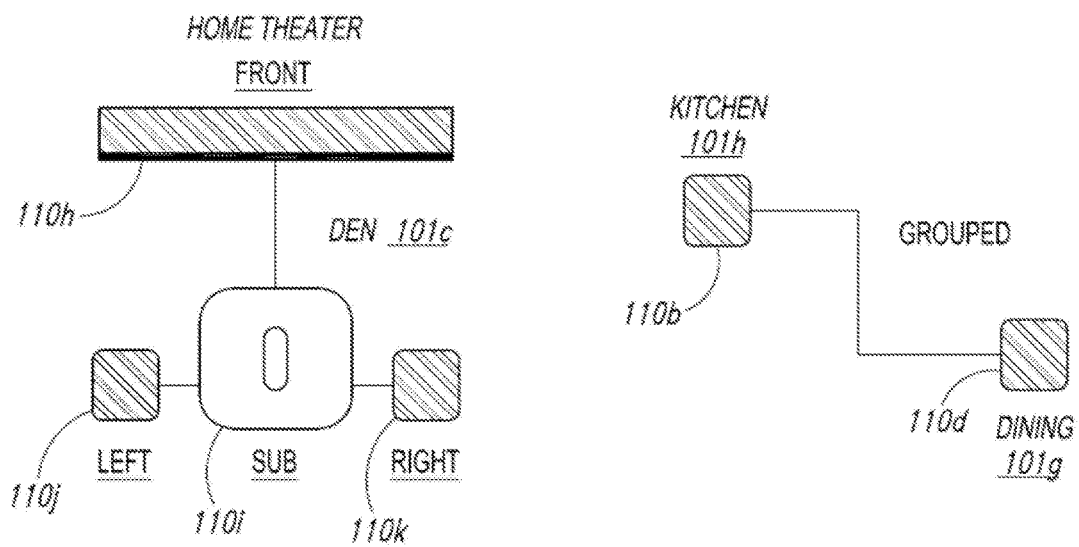

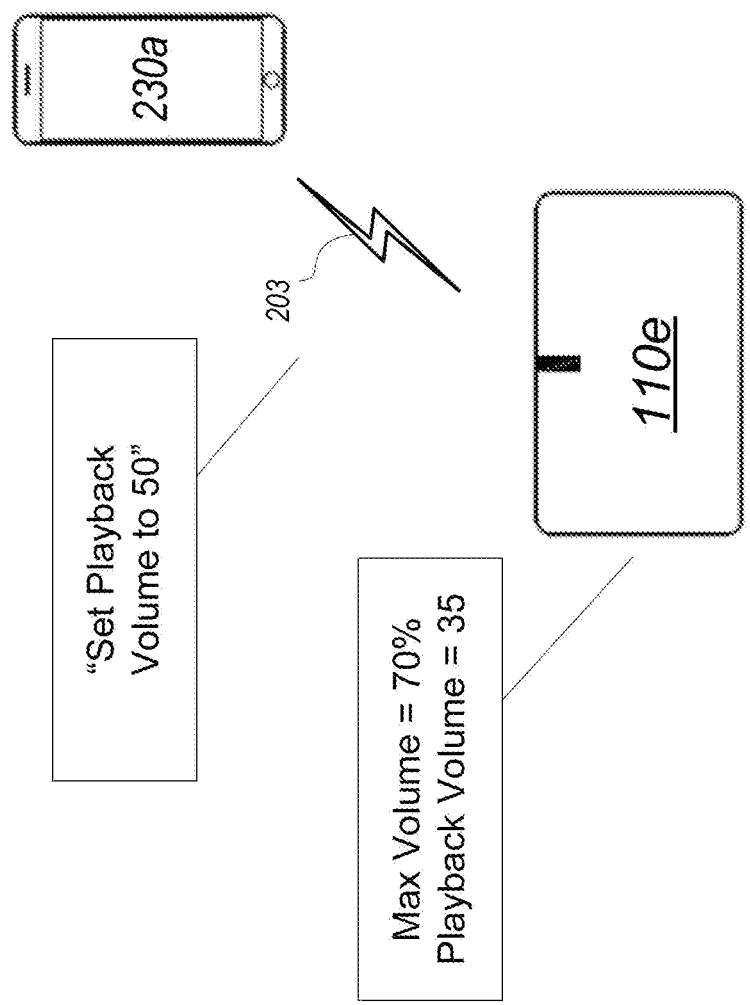

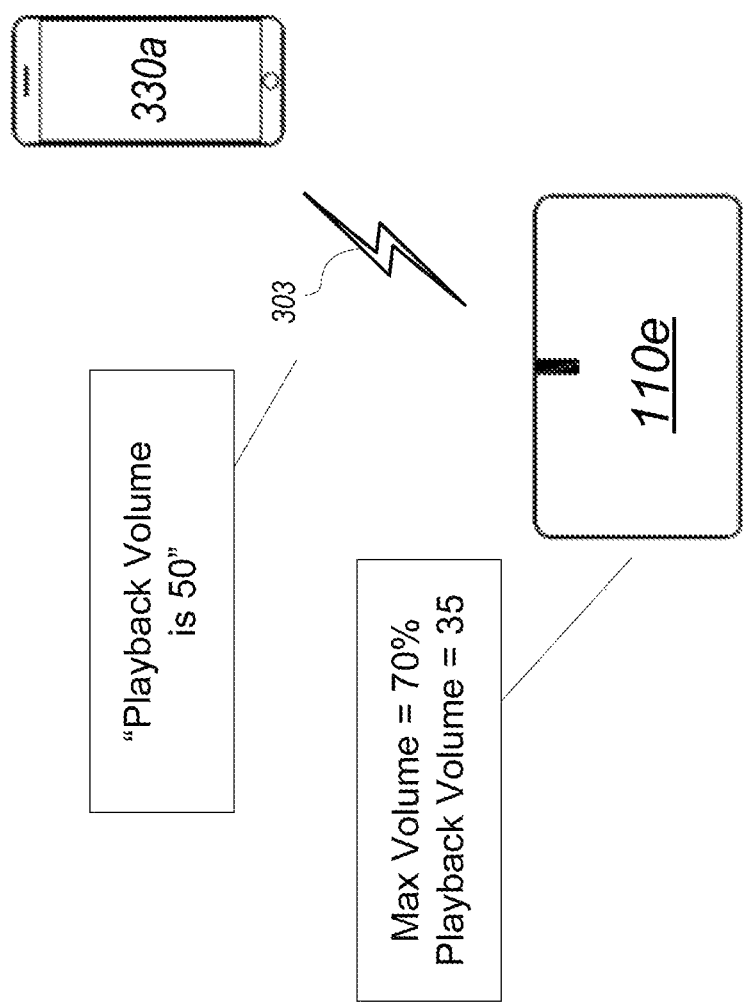

Max Volume = 70%
Playback Volume = 17.5

Max Volume = 70%
Playback Volume = 35

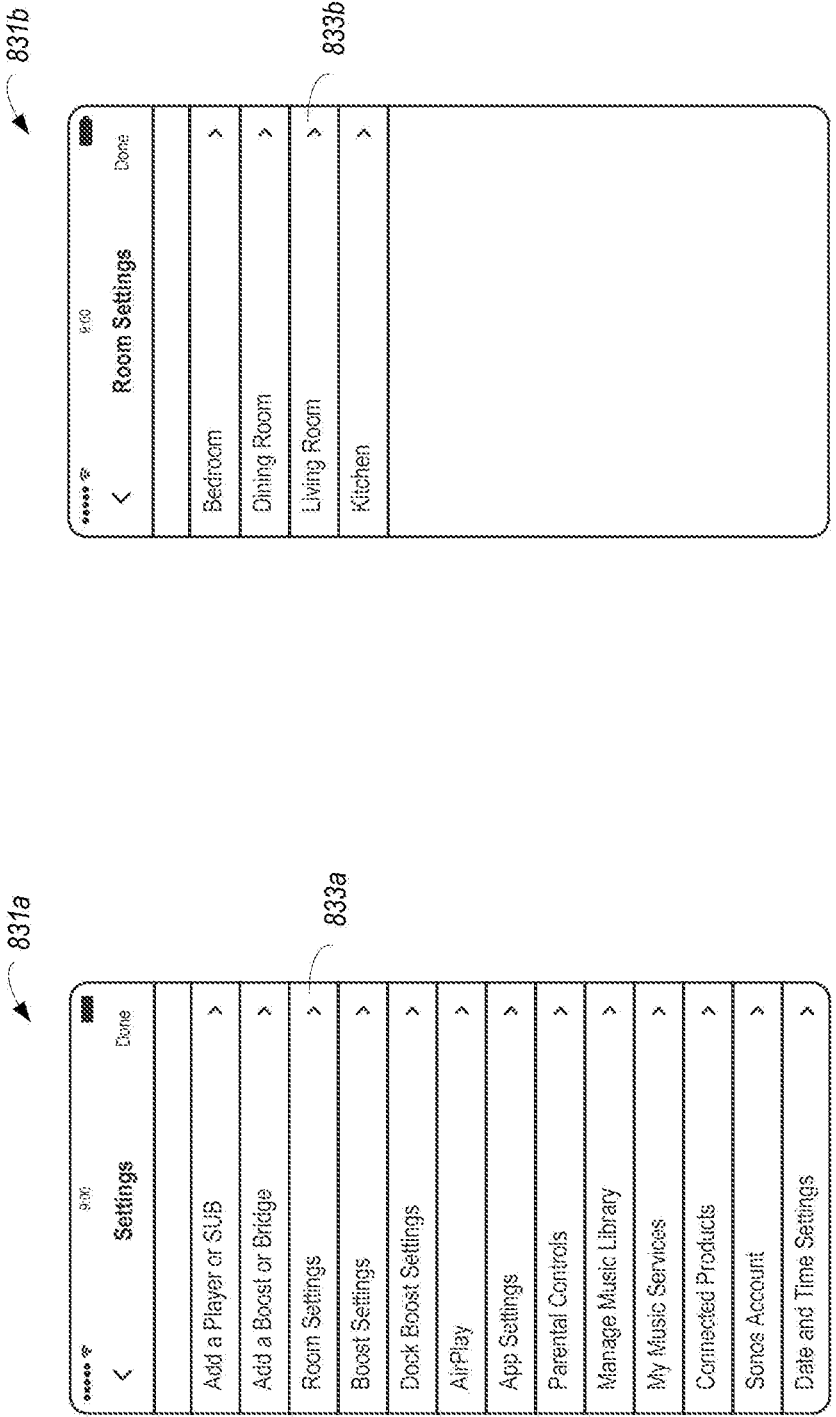

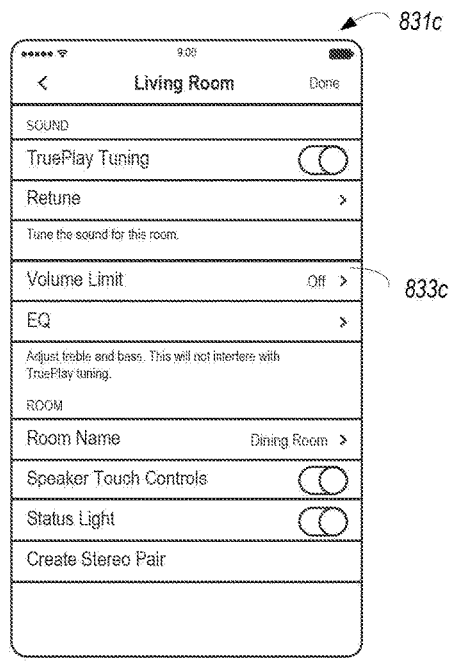
Fig. 8C
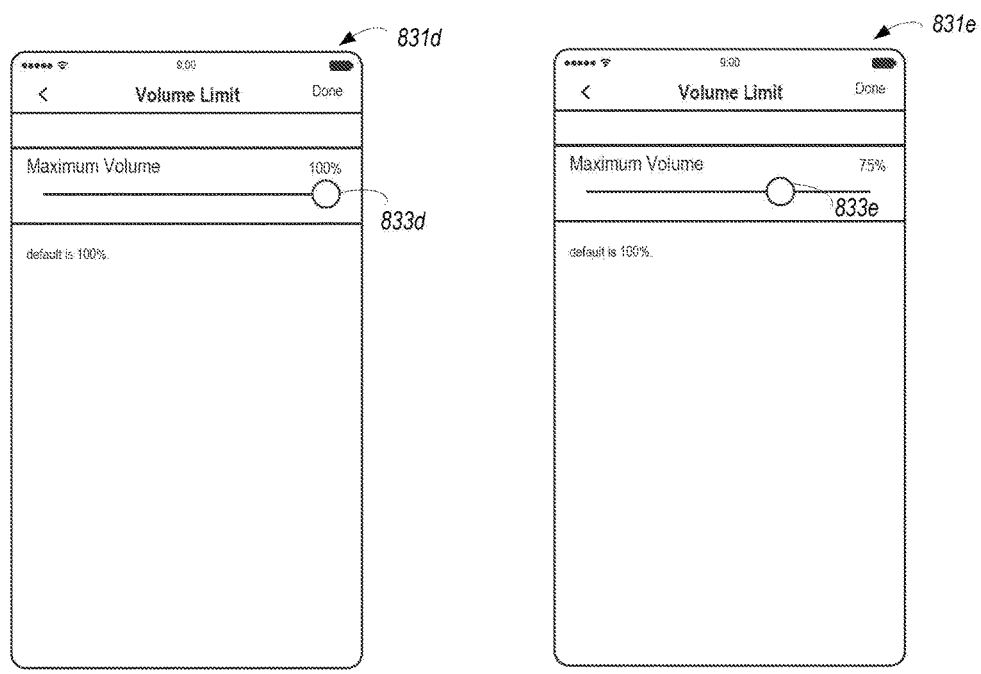
Fig. 8D
Fig. 8E

MEDIA PLAYBACK SYSTEM WITH MAXIMUM VOLUME SETTING

CROSS-REFERENCE TO RELATED APPLICATION

This application claims the benefit of priority under 35 U.S.C. § 119(e) to U.S. provisional application No. 62/723,942, filed on Aug. 28, 2018 and titled "Playback Device Control", the contents of which is incorporated by reference herein in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F is a block diagram of a network microphone device.
FIG. 1G is a block diagram of a playback device.
FIG. 1H is a partially schematic diagram of a control device.
FIGS. 1I through 1L are schematic diagrams of corresponding media playback system zones.
FIG. 2 is a schematic diagram of a controller device and a playback device in accordance with aspects of the disclosed technology.
FIG. 3 is a schematic diagram of a controller device and a playback device in accordance with aspects of the disclosed technology.
FIGS. 8A-8H are depictions of user interfaces in accordance with aspects of the disclosed technology.

Figure 1A:
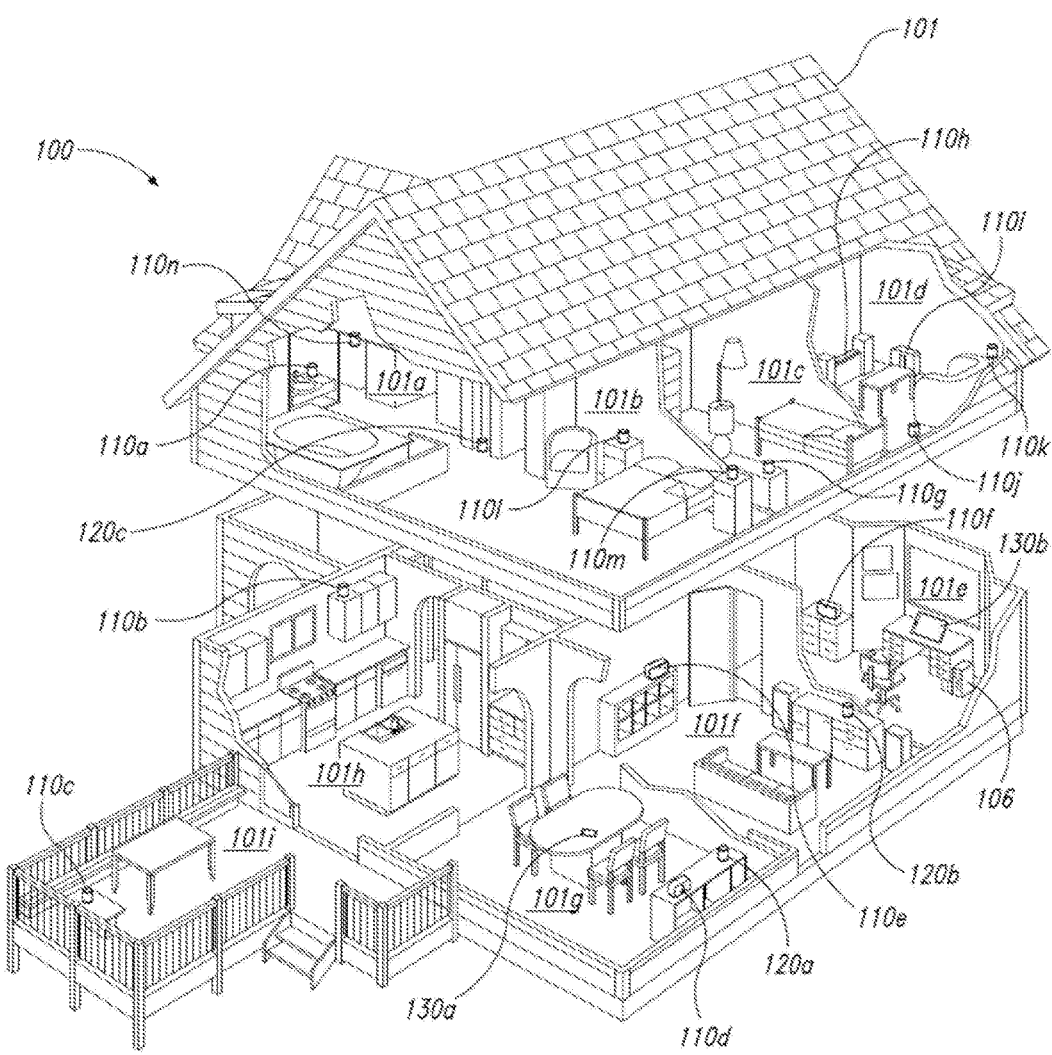
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Embodiments described herein generally relate to alternative ways of adjusting the volume of playback devices in a media playback system. As a general matter, playback devices in a media playback system typically maintain certain state variables that represent the operational state of the playback devices. One such state variable is a playback volume state variable, which represents the current playback volume of the playback device. Typically, the playback volume state variable is an integer value ranging from 0 to 100 (where 0 represents no audible sound and 100 represents the loudest volume at which the playback device is configured to output sound). When a playback device renders and outputs amplified audio signals, it generally does so at a volume level commensurate with its playback volume state variable. For example, if a playback device's playback volume state variable is 50, that playback device will generally render and output an amplified audio signal at a volume level that is about 50% of the loudest volume at which the playback device is configured to output sound.

In order to keep the controller devices and the other playback devices in a media playback system up-to-date, a playback device typically shares certain of its state variables among the other devices in the media playback system. For instance, a controller device may periodically receive updates regarding the playback volume state variables of the playback devices in a media playback system. This enables controller devices to accurately represent the operational state of the playback devices in the media playback system. For instance, a controller device may receive a message indicating that the playback volume of a particular playback device is 50. As a result, the controller device can then present, for example, via a graphical user interface, an indication that the particular playback device is operating at volume level 50.

In general, playback devices adjust their playback volumes upon receiving an instruction to do so. In operation, such an instruction typically comes from a controller device communicatively coupled to playback devices in the media playback system or through an interface of the playback device, such as a button or a touch-sensitive surface on the playback device. For instance, a controller device may receive a request from a user to increase the volume level of a particular playback device to a volume level of 30. The controller device responsively sends an instruction to the particular playback device to adjust its playback volume state variable to 30. And, upon receiving such an instruction, the particular playback device responds accordingly by adjusting its playback volume state variable to 30. Once the playback volume state variable is adjusted, the particular playback device may then transmit data indicating the updated playback volume state variable to the controller device and/or other devices in the media playback system.

There may be times where it is desirable to limit the volume adjustment range for a particular playback device. That is, even though it may be possible for a particular playback device to operate at full volume, a user may desire that the volume level for that playback device not exceed, for example, a volume level of 75. For instance, a playback device positioned near a shared wall might disturb a neighbor if the volume level for that playback device exceeds 75. Accordingly, playback devices may be configured to operate with a maximum volume feature in which volume control operates normally except that instructions to adjust the volume past a set maximum volume level (e.g., a volume level of 75) result in the playback device setting its playback volume to the maximum level. In operation for instance, a particular playback device's maximum volume level may be set to not exceed a playback volume of 75. If the playback device receives an instruction to set its playback volume to any level less than the maximum volume level of 75, the playback device sets its playback volume to the requested level. If, however, the playback device receives an instruction to adjust its playback volume to a volume level that meets or exceeds the maximum volume level (e.g., volume level 90), the playback device will respond by setting its playback volume state variable to the maximum level of 75.

This functionality, though it results in limiting playback volume to a particular level, may not offer an appropriate user experience. In particular, as mentioned before, controller devices generally represent through a user interface certain operational states of the playback devices in the media playback system, including, for instance, the current volume levels of the playback devices in the media playback system. In accordance with the above description, when one of these playback devices is operating with a maximum volume feature, and the controller device receives a request to adjust the volume level of that playback device to a volume level that exceeds the maximum volume, the controller device may send a corresponding instruction to the playback device, but the playback device responds by setting its playback volume to the maximum volume level. This may appear to the user that her volume adjustment request was misinterpreted or ignored altogether.

For instance, if a user provides a user input to a controller device requesting that the volume level for a particular playback device be set at 90, the controller device responsively sends an instruction to the playback device to adjust is playback volume to 90. But if the particular playback device is configured to limit its volume level to, say, 75, the playback device sets its playback volume to 75, not 90. The controller device thereafter receives an indication that the playback device's playback volume is 75, and the controller device responsively displays an indication that the playback device is operating at a volume level of 75. This may thus appear to the user that her request to adjust the volume to level 90 was misinterpreted as a request to adjust the volume level to 75. In addition, further requests to adjust the volume past the maximum volume level of 75 will result in no change to the volume level of the playback device, and as such, it may appear to the user that her further requests to adjust the volume for that playback device are being ignored.

To improve user experience with media playback systems, disclosed herein are alternate ways of adjusting and communicating the playback volume for playback devices utilizing a maximum volume feature. Generally, these alternate ways of adjusting playback volume utilize a maximum volume state variable, whereby when a playback device receives an instruction to change its playback volume to a requested volume level, the playback device will not necessarily set its playback volume state variable to the requested volume level. Rather, the playback device will calculate a new (typically lower) alternate volume level based on the maximum volume state variable and instead set its playback volume state variable to that alternate volume level. Moreover, when a playback device shares certain of its state variables among the other devices of the media playback system (e.g., a controller device), the playback device will not necessarily share its actual playback volume state variable, but rather will calculate a new (typically higher) representative volume level and instead share that representative volume level.

In accordance with example embodiments, for instance, a playback device maintains an additional state variable referred to as a maximum volume state variable. When the playback device receives an instruction to adjust its playback volume to a requested level, the playback device defines an alternative volume level, which it may define in a variety of manners. As one possibility, the playback device multiplies the maximum volume state variable by the requested volume level to arrive at the alternate volume level. In any case, the playback device then sets its playback volume state variable to this alternate level.

In accordance with example embodiments, for instance, a playback device may also divide its playback volume level by the maximum volume state variable to arrive at a representative volume level. When sharing state variables with other devices in the media playback system, the playback device shares an indication of this representative volume level instead of the playback device's actual playback volume level. Thus, when a controller device receives an indication of this representative volume level, it will present, via a user interface, an indication that the playback device is operating at the representative volume level even though the playback device is operating at a different playback volume level.

This functionality may help to minimize the shortcomings of other approaches for operating with a maximum volume feature. Indeed, in operation according to the embodiments disclosed herein, requests to adjust the volume of a playback device may result in changes to the playback volume of that playback device, even when such requests appear to request a volume level that exceeds a maximum volume level set for that playback device. Moreover, controller devices may represent that playback devices are operating at the volume levels requested by the user, even when the user requests a volume level that exceeds a maximum volume level set for that playback device. Accordingly, this may result in an improved user experience.

Thus, in one aspect, provided herein is a controller device that comprises a network interface, an input interface, at least one processor, and a non-transitory computer-readable medium having instructions stored thereon. The network interface is configured to communicatively couple the controller device to at least one playback device of a media playback system. And the instructions stored on the computer-readable medium, when executed by the at least one processor, cause the controller device to receive, via the input interface, a request to change a volume level of the at least one playback device to a requested volume level, send, via the network interface to the at least one playback device, an instruction indicative of the requested change to the volume level, wherein sending the instruction causes the at least one playback device to adjust a volume level of the at least one playback device to an alternate volume level that is different from the requested volume level, and after the volume level of the at least one playback device has been adjusted to the alternate volume level, output an indication of an adjustment to the volume level of the at least one playback device, wherein the indication of the adjustment is representative of the requested volume level.

In another aspect, provided herein is a playback device that comprises a network interface, at least one processor; and a tangible, non-transitory computer-readable medium having instructions stored thereon. The network interface is configured to communicatively couple the playback device, via a local communication network, to (i) at least one additional playback device of the media playback system and (ii) a controller device. And the instructions stored on the computer-readable medium, when executed by the at least one processor, cause the playback device to receive, from the controller device via the network interface, an instruction to change a volume level of the playback device to a requested volume level, based on a stored volume variable, adjust a volume level of the playback device to an alternate volume level that is different from the requested volume level, and after adjusting the volume level of the playback device to the alternate volume level, cause, via the network interface, the controller device to output an indication of an adjustment to the volume level of the playback device, wherein the indication of the adjustment is representative of the requested volume level.

In another aspect, provided herein is a non-transitory computer-readable medium having instructions stored thereon, which, when executed by one or more processors, cause a playback device of a media playback system to receive an instruction to change a volume level of the playback device to a requested volume level, based on a stored volume variable, adjust a volume level of the playback device to an alternate volume level that is different from the requested volume level, and after adjusting the volume level of the playback device to the alternate volume level, cause a controller device to output an indication of an adjustment to the volume level of the playback device, wherein the indication of the adjustment is representative of the requested volume level.

In another aspect, provided herein is a method that comprises receiving a request to change a volume level of at least one playback device to a requested volume level, sending to the at least one playback device an instruction indicative of the requested change to the volume level, wherein sending the instruction causes the at least one playback device to adjust a volume level of the at least one playback device to an alternate volume level that is different from the requested volume level, and after the volume level of the at least one playback device has been adjusted to the alternate volume level, output an indication of an adjustment to the volume level of the at least one playback device, wherein the indication of the adjustment is representative of the requested volume level.

In another respect, provided herein is another method. This method comprises receiving from a controller device an instruction to change a volume level of the playback device to a requested volume level, based on a stored volume variable, adjusting a volume level of the playback device to an alternate volume level that is different from the requested volume level, and after adjusting the volume level of the playback device to the alternate volume level, causing, via the network interface, the controller device to output an indication of an adjustment to the volume level of the playback device, wherein the indication of the adjustment is representative of the requested volume level.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-6.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B and 1E and 1I-1M.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
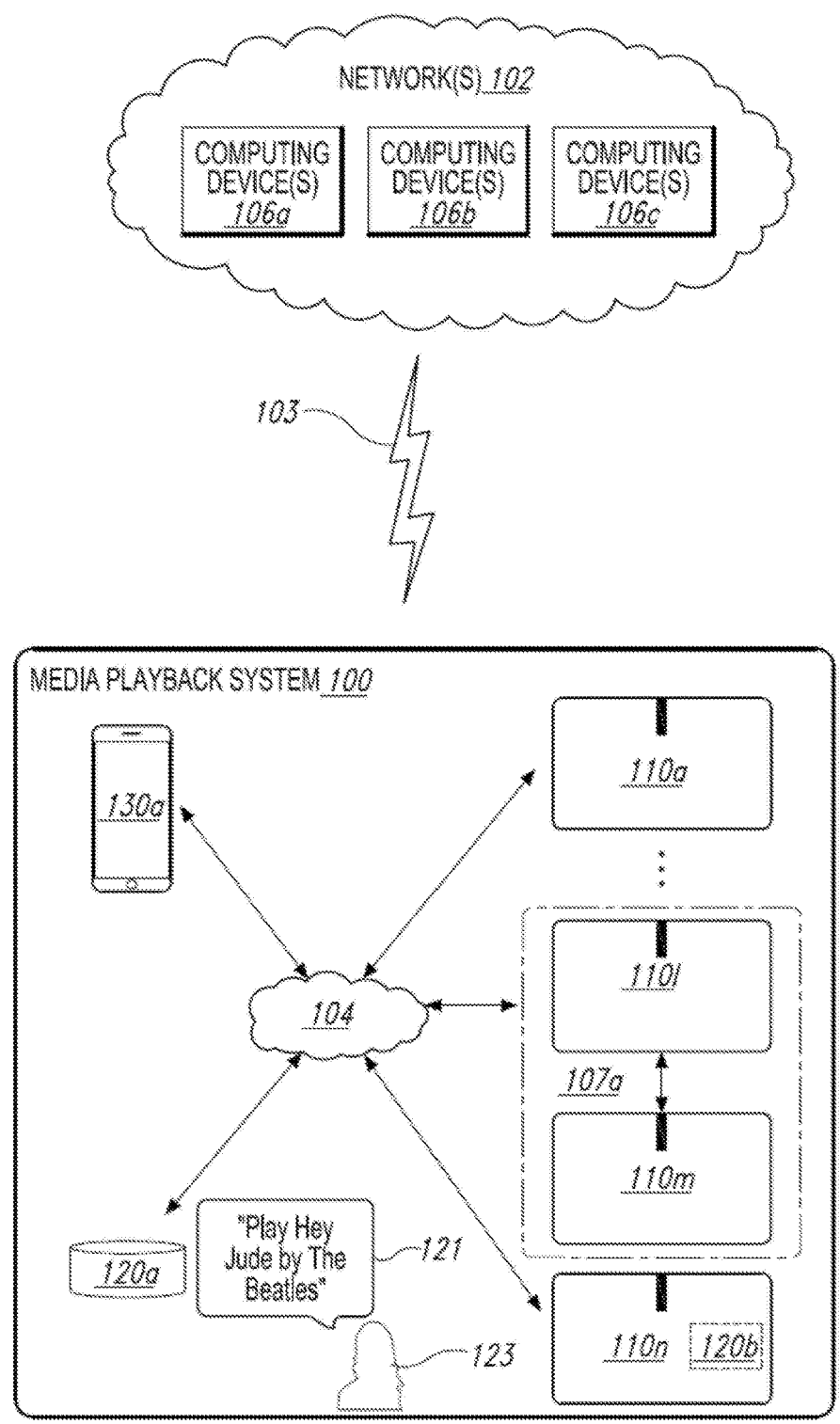
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110l and 110m comprise a group 107a. The playback devices 110l and 110m can be positioned in different rooms in a household and be grouped together in the group 107a on a temporary or permanent basis based on user input received at the control device 130a and/or another control device 130 in the media playback system 100. When arranged in the group 107a, the playback devices 110l and 110m can be configured to play back the same or similar audio content in synchrony from one or more audio content sources. In certain embodiments, for example, the group 107a comprises a bonded zone in which the playback devices 110l and 110m comprise left audio and right audio channels, respectively, of multi-channel audio content, thereby producing or enhancing a stereo effect of the audio content. In some embodiments, the group 107a includes additional playback devices 110. In other embodiments, however, the media playback system 100 omits the group 107a and/or other grouped arrangements of the playback devices 110. Additional details regarding groups and other arrangements of playback devices are described in further detail below with respect to FIGS. 1I through 1M.

The media playback system 100 includes the NMDs 120a and 120b, each comprising one or more microphones configured to receive voice utterances from a user. In the illustrated embodiment of FIG. 1B, the NMD 120a is a standalone device and the NMD 120b is integrated into the playback device 110n. The NMD 120a, for example, is configured to receive voice input 121 from a user 123. In some embodiments, the NMD 120a transmits data associated with the received voice input 121 to a voice assistant service (VAS) configured to (i) process the received voice input data and (ii) transmit a corresponding command to the media playback system 100. In some aspects, for example, the computing device 106c comprises one or more modules and/or servers of a VAS (e.g., a VAS operated by one or more of SONOS®, AMAZON®, GOOGLE® APPLE®, MICROSOFT®). The computing device 106c can receive the voice input data from the NMD 120a via the network 104 and the links 103. In response to receiving the voice input data, the computing device 106c processes the voice input data (i.e., "Play Hey Jude by The Beatles"), and determines that the processed voice input includes a command to play a song (e.g., "Hey Jude"). The computing device 106c accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
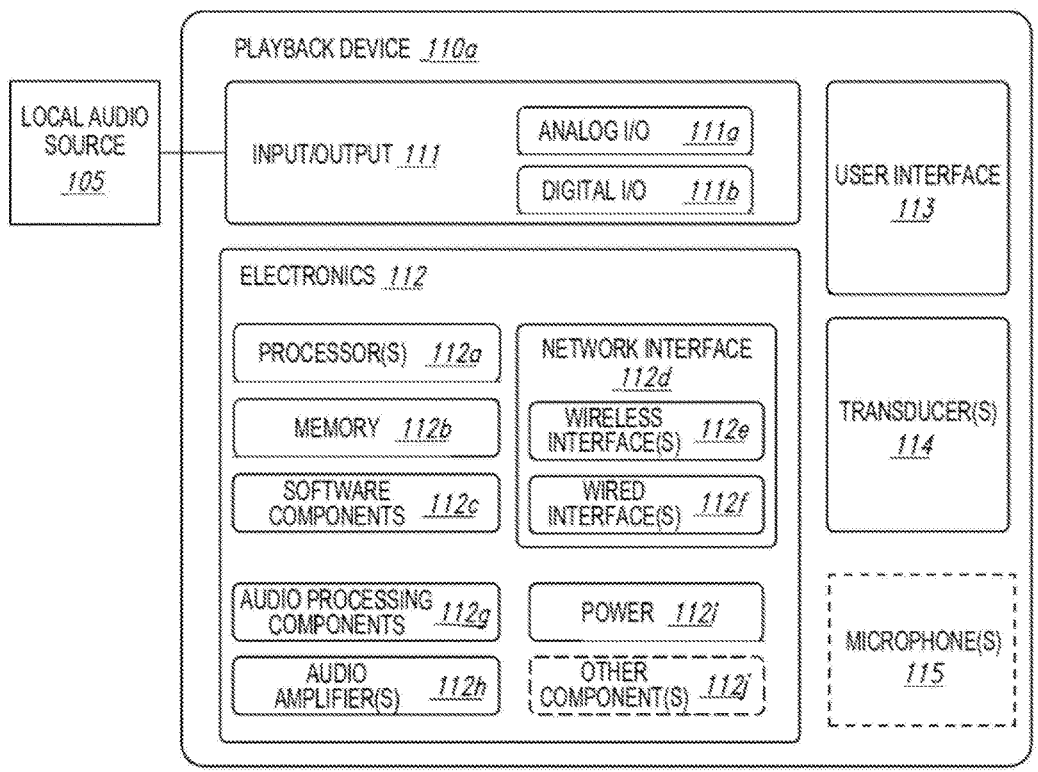
FIG. 1C is a block diagram of a playback device.

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises an High-Definition Multimedia Interface (HDMI) interface and/or cable. In some embodiments, the digital I/O 111b includes one or more wireless communication links comprising, for example, a radio frequency (RF), infrared, WiFi, Bluetooth, or another suitable communication protocol. In certain embodiments, the analog I/O 111a and the digital 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110a does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B)), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
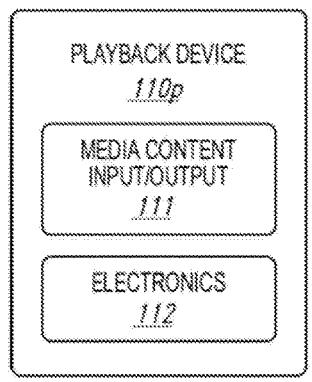
FIG. 1D is a block diagram of a playback device.

By way of illustration, SONOS, Inc. presently offers (or has offered) for sale certain playback devices including, for example, a "SONOS ONE," "PLAY:1," "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skill in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
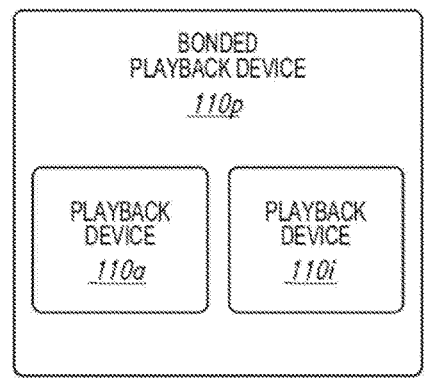
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110*l* and 110*m* of FIG. 1B). In some embodiments, for example, the playback device 110*a* is full-range playback device configured to render low frequency, mid-range frequency, and high frequency audio content, and the playback device 110*i* is a subwoofer configured to render low frequency audio content. In some aspects, the playback device 110*a*, when bonded with the first playback device, is configured to render only the mid-range and high frequency components of a particular audio content, while the playback device 110*i* renders the low frequency component of the particular audio content. In some embodiments, the bonded playback device 110*q* includes additional playback devices and/or another bonded playback device.

c. Suitable Network Microphone Devices (NMDs)

FIG. 1F is a block diagram of the NMD 120*a* (FIGS. 1A and 1B). The NMD 120*a* includes one or more voice processing components 124 (hereinafter "the voice components 124") and several components described with respect to the playback device 110*a* (FIG. 1C) including the processors 112*a*, the memory 112*b*, and the microphones 115. The NMD 120*a* optionally comprises other components also included in the playback device 110*a* (FIG. 1C), such as the user interface 113 and/or the transducers 114. In some embodiments, the NMD 120*a* is configured as a media playback device (e.g., one or more of the playback devices 110), and further includes, for example, one or more of the audio components 112*g* (FIG. 1C), the amplifiers 114, and/or other playback device components. In certain embodiments, the NMD 120*a* comprises an Internet of Things (IoT) device such as, for example, a thermostat, alarm panel, fire and/or smoke detector, etc. In some embodiments, the NMD 120*a* comprises the microphones 115, the voice processing 124, and only a portion of the components of the electronics 112 described above with respect to FIG. 1B. In some aspects, for example, the NMD 120*a* includes the processor 112*a* and the memory 112*b* (FIG. 1B), while omitting one or more other components of the electronics 112. In some embodiments, the NMD 120*a* includes additional components (e.g., one or more sensors, cameras, thermometers, barometers, hygrometers).

In some embodiments, an NMD can be integrated into a playback device. FIG. 1G is a block diagram of a playback device 110*r* comprising an NMD 120*d*. The playback device 110*r* can comprise many or all of the components of the playback device 110*a* and further include the microphones 115 and voice processing 124 (FIG. 1F). The playback device 110*r* optionally includes an integrated control device 130*c*. The control device 130*c* can comprise, for example, a user interface (e.g., the user interface 113 of FIG. 1B) configured to receive user input (e.g., touch input, voice input) without a separate control device. In other embodiments, however, the playback device 110*r* receives commands from another control device (e.g., the control device 130*a* of FIG. 1B).

Referring again to FIG. 1F, the microphones 115 are configured to acquire, capture, and/or receive sound from an environment (e.g., the environment 101 of FIG. 1A) and/or a room in which the NMD 120*a* is positioned. The received sound can include, for example, vocal utterances, audio played back by the NMD 120*a* and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home.

d. Suitable Control Devices

FIG. 1H is a partially schematic diagram of the control device 130*a* (FIGS. 1A and 1B). As used herein, the term "control device" can be used interchangeably with "controller" or "control system." Among other features, the control device 130*a* is configured to receive user input related to the media playback system 100 and, in response, cause one or more devices in the media playback system 100 to perform an action(s) or operation(s) corresponding to the user input. In the illustrated embodiment, the control device 130*a* comprises a smartphone (e.g., an iPhone™, an Android phone) on which media playback system controller application software is installed. In some embodiments, the control device 130*a* comprises, for example, a tablet (e.g., an iPad™), a computer (e.g., a laptop computer, a desktop computer), and/or another suitable device (e.g., a television, an automobile audio head unit, an IoT device). In certain embodiments, the control device 130*a* comprises a dedicated controller for the media playback system 100. In other embodiments, as described above with respect to FIG. 1G, the control device 130*a* is integrated into another device in the media playback system 100 (e.g., one more of the playback devices 110, NMDs 120, and/or other suitable devices configured to communicate over a network).

The control device 130*a* includes electronics 132, a user interface 133, one or more speakers 134, and one or more microphones 135. The electronics 132 comprise one or more processors 132*a* (referred to hereinafter as "the processors 132*a*"), a memory 132*b*, software components 132*c*, and a network interface 132*d*. The processor 132*a* can be configured to perform functions relevant to facilitating user access, control, and configuration of the media playback system 100. The memory 132*b* can comprise data storage that can be loaded with one or more of the software components executable by the processor 302 to perform those functions. The software components 132*c* can comprise applications and/or other executable software configured to facilitate control of the media playback system 100. The memory 112*b* can be configured to store, for example, the software components 132*c*, media playback system controller application software, and/or other data associated with the media playback system 100 and the user.

The network interface 132*d* is configured to facilitate network communications between the control device 130*a* and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132*d* can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132*d* can transmit a playback device control command (e.g., volume control, audio playback control, audio content selection) from the control device 304 to one or more of the playback devices 100. The network interface 132*d* can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others. Additional description of zones and groups can be found below with respect to FIGS. 1I through 1M.

The user interface 133 is configured to receive user input and can facilitate 'control of the media playback system 100. The user interface 133 includes media content art 133*a* (e.g., album art, lyrics, videos), a playback status indicator 133*b* (e.g., an elapsed and/or remaining time indicator), media content information region 133*c*, a playback control region 133*d*, and a zone indicator 133*e*. The media content information region 133*c* can include a display of relevant information (e.g., title, artist, album, genre, release year) about media content currently playing and/or media content in a queue or playlist. The playback control region 133*d* can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133*d* may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130*a*. In some embodiments, the one or more speakers comprise individual transducers configured to correspondingly output low frequencies, mid-range frequencies, and/or high frequencies. In some aspects, for example, the control device 130*a* is configured as a playback device (e.g., one of the playback devices 110). Similarly, in some embodiments the control device 130*a* is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130*a* is configured to operate as playback device and an NMD. In other embodiments, however, the control device 130*a* omits the one or more speakers 134 and/or the one or more microphones 135. For instance, the control device 130*a* may comprise a device (e.g., a thermostat, an IoT device, a network device) comprising a portion of the electronics 132 and the user interface 133 (e.g., a touch screen) without any speakers or microphones. Additional control device embodiments are described in further detail below with respect to FIGS. 4A-4D and 5.

e. Suitable Playback Device Configurations

Figure 1M:
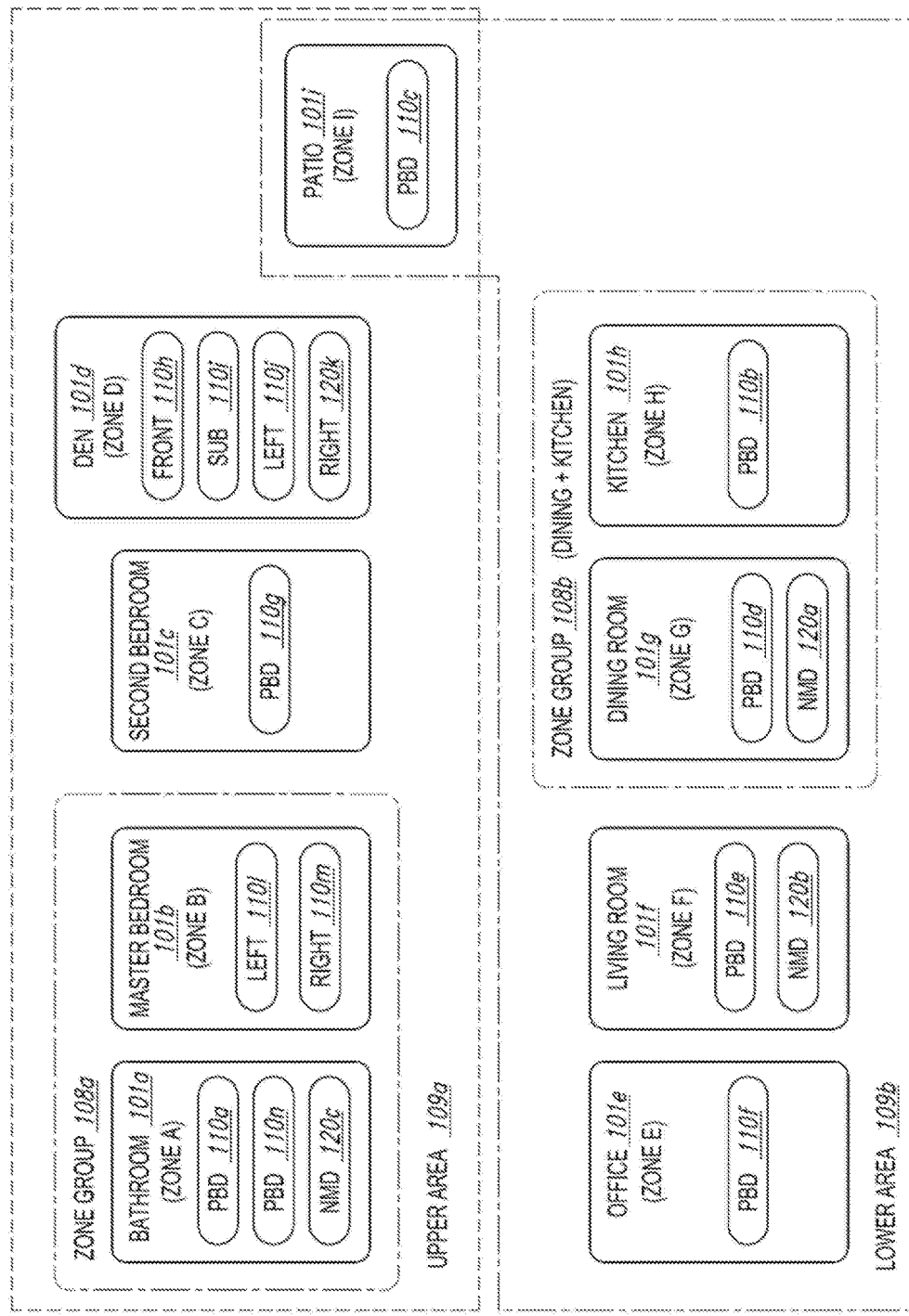
FIG. 1M is a schematic diagram of media playback system areas.

FIGS. 1I through 1M show example configurations of playback devices in zones and zone groups. Referring first to FIG. 1M, in one example, a single playback device may belong to a zone. For example, the playback device 110*g* in the second bedroom 101*c* (FIG. 1A) may belong to Zone C. In some implementations described below, multiple playback devices may be "bonded" to form a "bonded pair" which together form a single zone. For example, the playback device 110*l* (e.g., a left playback device) can be bonded to the playback device 110*m* (e.g., a right playback device) to form Zone A. Bonded playback devices may have different playback responsibilities (e.g., channel responsibilities). In another implementation described below, multiple playback devices may be merged to form a single zone. For example, the playback device 110*h* (e.g., a front playback device) may be merged with the playback device 110*i* (e.g., a subwoofer), and the playback devices 110*j* and 110*k* (e.g., left and right surround speakers, respectively) to form a single Zone D. In another example, the playback devices 110*g* and 110*h* can be merged to form a merged group or a zone group 108*b*. The merged playback devices 110*g* and 110*h* may not be specifically assigned different playback responsibilities. That is, the merged playback devices 110*h* and 110*i* may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1I, the playback devices 110*l* and 110*m* may be bonded so as to produce or enhance a stereo effect of audio content. In this example, the playback device 110*l* may be configured to play a left channel audio component, while the playback device 110*k* may be configured to play a right channel audio component. In some implementations, such stereo bonding may be referred to as "pairing."

Additionally, bonded playback devices may have additional and/or different respective speaker drivers. As shown in FIG. 1J, the playback device 110*h* named Front may be bonded with the playback device 110*i* named SUB. The Front device 110*h* can be configured to render a range of mid to high frequencies and the SUB device 110*i* can be configured render low frequencies. When unbonded, however, the Front device 110*h* can be configured render a full range of frequencies. As another example, FIG. 1K shows the Front and SUB devices 110*h* and 110*i* further bonded with Left and Right playback devices 110*j* and 110*k*, respectively. In some implementations, the Right and Left devices 110*j* and 102*k* can be configured to form surround or "satellite" channels of a home theater system. The bonded playback devices 110*h*, 110*i*, 110*j*, and 110*k* may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110*a* and 110*n* the master bathroom have the single UI entity of Zone A. In one embodiment, the playback devices 110*a* and 110*n* may each output the full range of audio content each respective playback devices 110*a* and 110*n* are capable of, in synchrony.

In some embodiments, an NMD is bonded or merged with another device so as to form a zone. For example, the NMD 120*b* may be bonded with the playback device 110*e*, which together form Zone F, named Living Room. In other embodiments, a stand-alone network microphone device may be in a zone by itself. In other embodiments, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108*a* that includes the two zones. Similarly, Zone G may be grouped with Zone H to form the zone group 108*b*. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234, 395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108*b* can have be assigned a name such as "Dining+Kitchen", as shown in FIG. 1M. In some embodiments, a zone group may be given a unique name selected by a user.

Certain data may be stored in a memory of a playback device (e.g., the memory 112*c* of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some embodiments, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101*c* may indicate that the playback device is the only playback device of the Zone C and not in a zone group. Identifiers associated with the Den may indicate that the Den is not grouped with other zones but includes bonded playback devices 110*h*-110*k*. Identifiers associated with the Dining Room may indicate that the Dining Room is part of the Dining+Kitchen zone group 108*b* and that devices 110*b* and 110*d* are grouped (FIG. 1L). Identifiers associated with the Kitchen may indicate the same or similar information by virtue of the Kitchen being part of the Dining+Kitchen zone group 108*b*. Other example zone variables and identifiers are described below.

In yet another example, the media playback system 100 may store variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109*a* including Zones A-D, and a Lower Area 109*b* including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. application Ser. No. 15/682,506 filed Aug. 21, 2017 and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some embodiments, the media playback system 100 may not implement Areas, in which case the system may not store variables associated with Areas.

III. Example Systems and Devices

Figure 4A:
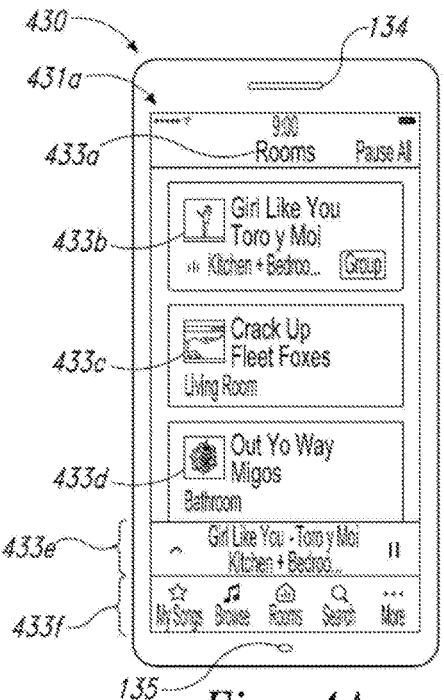
FIGS. 4A-4D are schematic diagrams of a control device in various stages of operation in accordance with aspects of the disclosed technology.
Figure 4B:
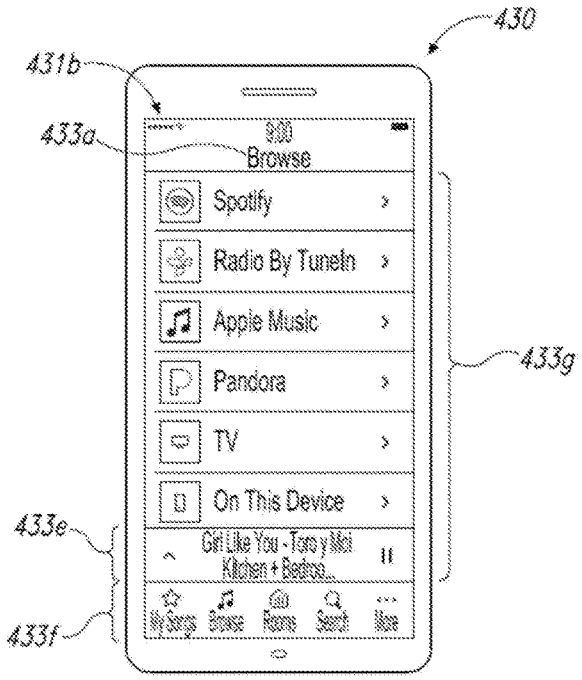
Figure 4C:
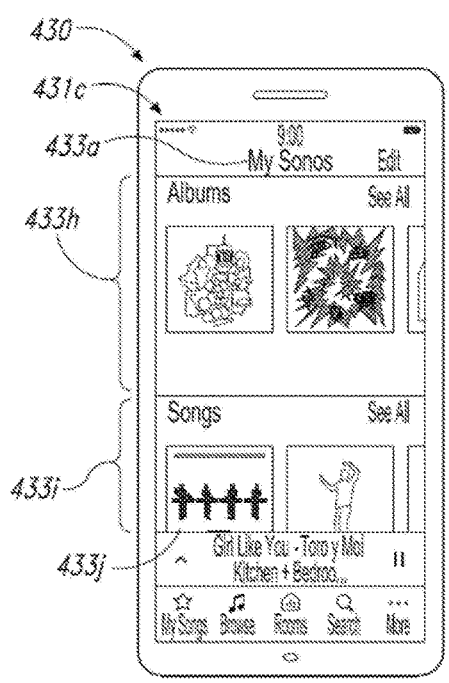
Figure 4D:
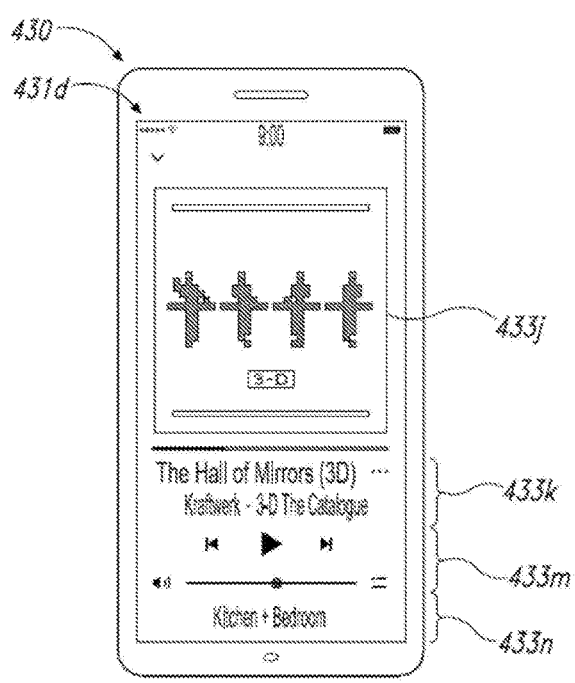

FIGS. 4A-4D are schematic diagrams of a control device 430 (e.g., the control device 130*a* of FIG. 1H, a smartphone, a tablet, a dedicated control device, an IoT device, and/or another suitable device) showing corresponding user interface displays in various states of operation. A first user interface display 431*a* (FIG. 4A) includes a display name 433*a* (i.e., "Rooms"). A selected group region 433*b* displays audio content information (e.g., artist name, track name, album art) of audio content played back in the selected group and/or zone. Group regions 433*c* and 433*d* display corresponding group and/or zone name, and audio content information audio content played back or next in a playback queue of the respective group or zone. An audio content region 433*e* includes information related to audio content in the selected group and/or zone (i.e., the group and/or zone indicated in the selected group region 433*b*). A lower display region 433*f* is configured to receive touch input to display one or more other user interface displays. For example, if a user selects "Browse" in the lower display region 433*f*, the control device 430 can be configured to output a second user interface display 431*b* (FIG. 4B) comprising a plurality of music services 433g (e.g., Spotify, Radio by Tunein, Apple Music, Pandora, Amazon, TV, local music, line-in) through which the user can browse and from which the user can select media content for play back via one or more playback devices (e.g., one of the playback devices 110 of FIG. 1A). Alternatively, if the user selects "My Sonos" in the lower display region 433f, the control device 430 can be configured to output a third user interface display 431c (FIG. 4C). A first media content region 433h can include graphical representations (e.g., album art) corresponding to individual albums, stations, or playlists. A second media content region 433i can include graphical representations (e.g., album art) corresponding to individual songs, tracks, or other media content. If the user selections a graphical representation 433j (FIG. 4C), the control device 430 can be configured to begin play back of audio content corresponding to the graphical representation 433j and output a fourth user interface display 431d fourth user interface display 431d includes an enlarged version of the graphical representation 433j, media content information 433k (e.g., track name, artist, album), transport controls 433m (e.g., play, previous, next, pause, volume), and indication 433n of the currently selected group and/or zone name.

Figure 5:
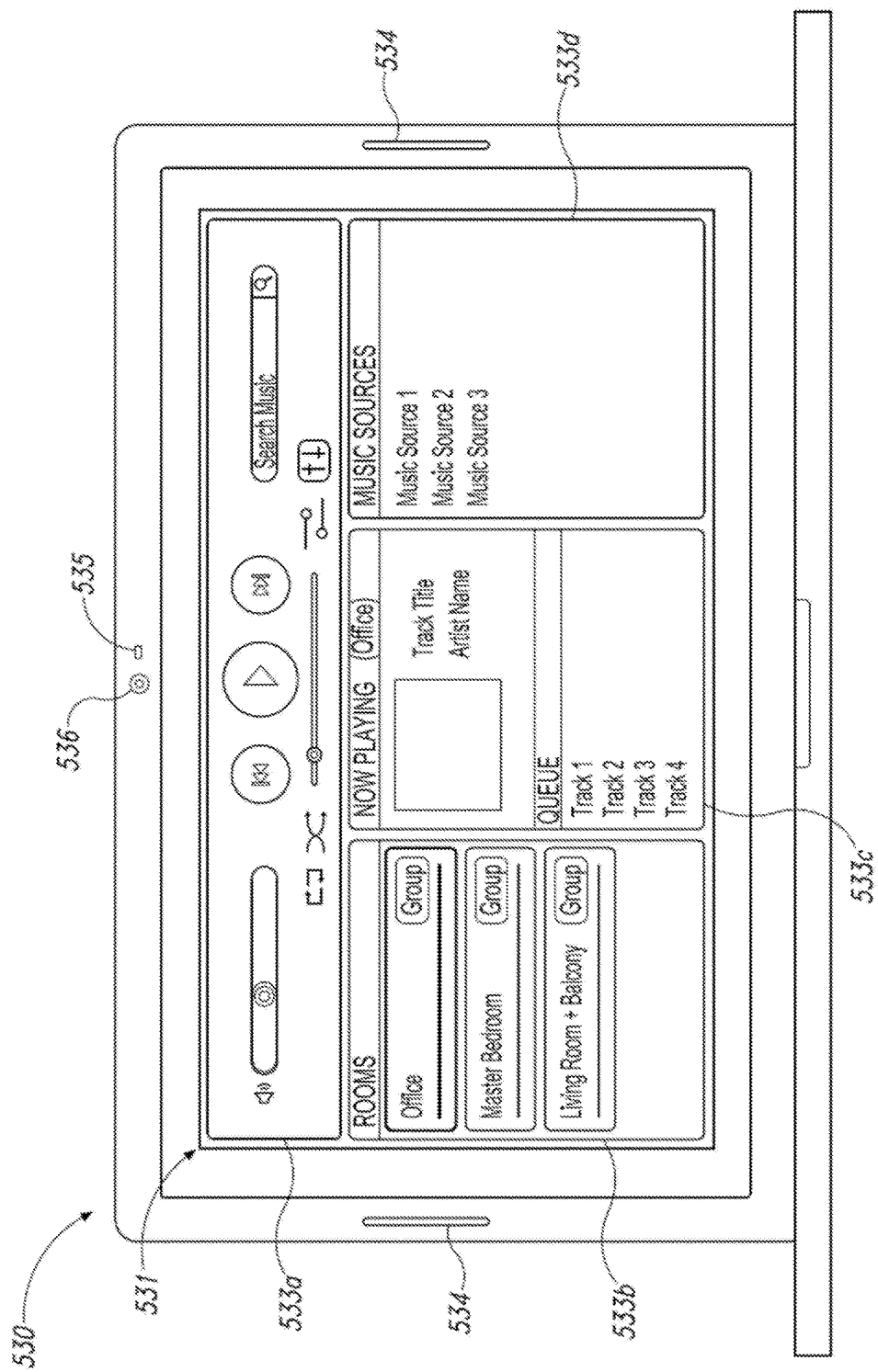
FIG. 5 is front view of a control device.

FIG. 5 is a schematic diagram of a control device 530 (e.g., a laptop computer, a desktop computer). The control device 530 includes transducers 534, a microphone 535, and a camera 536. A user interface 531 includes a transport control region 533a, a playback zone region 533b, a playback status region 533c, and a media content source region 533d. The transport control region 533a comprises one or more controls for controlling media playback including, for example, volume, previous, play/pause, next, repeat, shuffle, track position, crossfade, equalization, etc. The media content source region 533d includes a listing of one or more media content sources from which a user can select media items for play back and/or adding to a playback queue.

The playback zone region 533b can include representations of playback zones within the media playback system 100 (FIGS. 1A and 1B). In some embodiments, the graphical representations of playback zones may be selectable to bring up additional selectable icons to manage or configure the playback zones in the media playback system, such as a creation of bonded zones, creation of zone groups, separation of zone groups, renaming of zone groups, etc. In the illustrated embodiment, a "group" icon is provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone can be configured to play audio content in synchrony with the playback device(s) in the particular zone. Analogously, a "group" icon may be provided within a graphical representation of a zone group. In the illustrated embodiment, the "group" icon may be selectable to bring up options to deselect one or more zones in the zone group to be removed from the zone group. In some embodiments, the control device 530 includes other interactions and implementations for grouping and ungrouping zones via the user interface 531. In certain embodiments, the representations of playback zones in the playback zone region 533b can be dynamically updated as playback zone or zone group configurations are modified.

The playback status region 533c includes graphical representations of audio content that is presently being played, previously played, or scheduled to play next in the selected playback zone or zone group. The selected playback zone or zone group may be visually distinguished on the user interface, such as within the playback zone region 533b and/or a playback queue region. The graphical representations may include track title, artist name, album name, album year, track length, and other relevant information that may be useful for the user to know when controlling the media playback system 100 via the user interface 531.

The playback queue region includes graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device. In some embodiments, for example, a playlist can be added to a playback queue, in which information corresponding to each audio item in the playlist may be added to the playback queue. In some embodiments, audio items in a playback queue may be saved as a playlist. In certain embodiments, a playback queue may be empty, or populated but "not in use" when the playback zone or zone group is playing continuously streaming audio content, such as Internet radio that may continue to play until otherwise stopped, rather than discrete audio items that have playback durations. In some embodiments, a playback queue can include Internet radio and/or other streaming audio content items and be "in use" when the playback zone or zone group is playing those items.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped.

Figure 6:
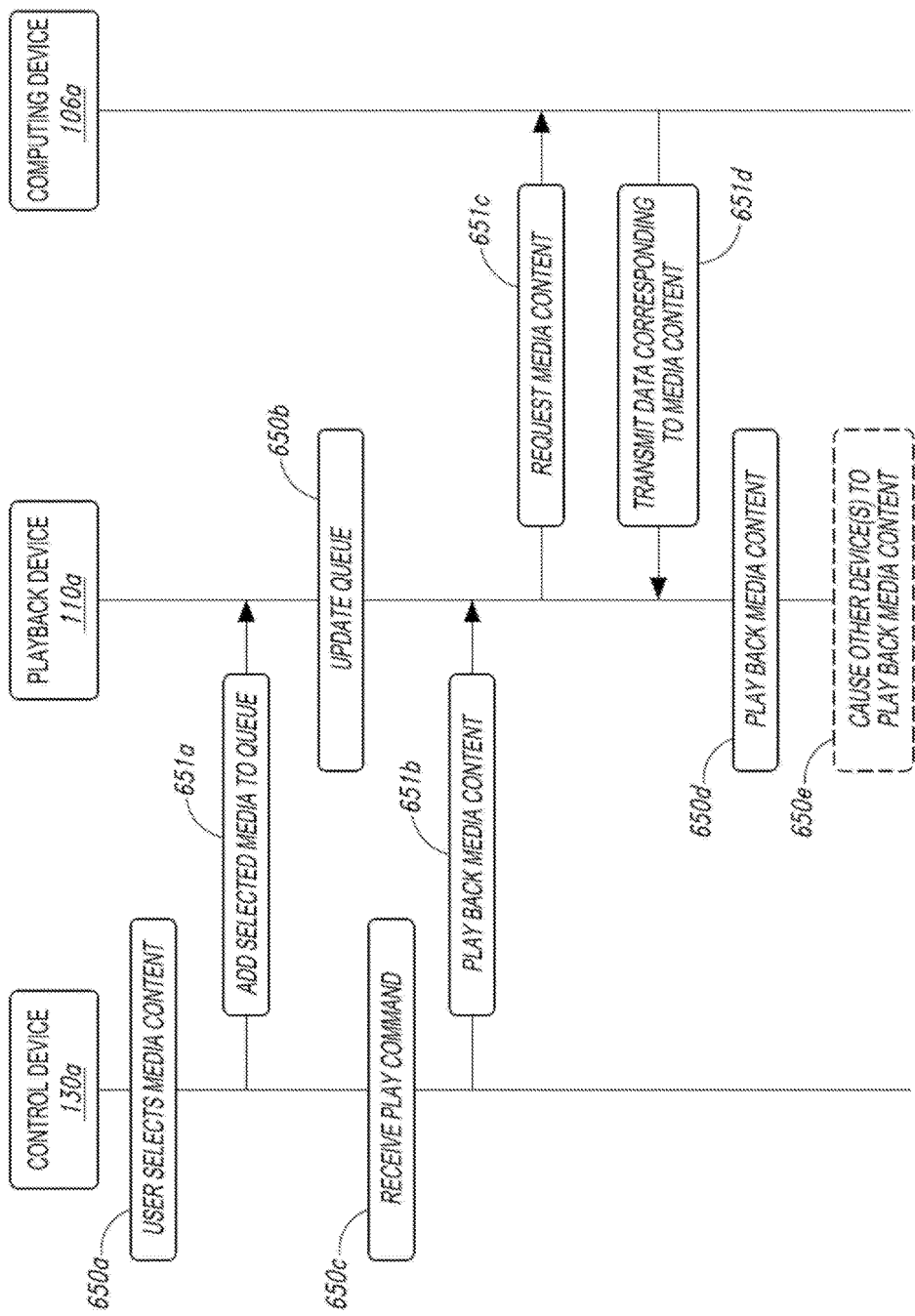
FIG. 6 is a message flow diagram of a media playback system.

FIG. 6 is a message flow diagram illustrating data exchanges between devices of the media playback system 100 (FIGS. 1A-1M).

At step 650a, the media playback system 100 receives an indication of selected media content (e.g., one or more songs, albums, playlists, podcasts, videos, stations) via the control device 130a. The selected media content can comprise, for example, media items stored locally on or more devices (e.g., the audio source 105 of FIG. 1C) connected to the media playback system and/or media items stored on one or more media service servers (one or more of the remote computing devices 106 of FIG. 1B). In response to receiving the indication of the selected media content, the control device 130a transmits a message 651a to the playback device 110a (FIGS. 1A-1C) to add the selected media content to a playback queue on the playback device 110a.

At step 650b, the playback device 110a receives the message 651a and adds the selected media content to the playback queue for play back.

At step 650c, the control device 130a receives input corresponding to a command to play back the selected media content. In response to receiving the input corresponding to the command to play back the selected media content, the control device 130a transmits a message 651b to the playback device 110a causing the playback device 110a to play back the selected media content. In response to receiving the message 651b, the playback device 110a transmits a message 651c to the computing device 106a requesting the selected media content. The computing device 106a, in response to receiving the message 651c, transmits a message 651d comprising data (e.g., audio data, video data, a URL, a URI) corresponding to the requested media content.

At step 650d, the playback device 110a receives the message 651d with the data corresponding to the requested media content and plays back the associated media content.

At step 650e, the playback device 110a optionally causes one or more other devices to play back the selected media content. In one example, the playback device 110a is one of a bonded zone of two or more players (FIG. 1M). The playback device 110a can receive the selected media content and transmit all or a portion of the media content to other devices in the bonded zone. In another example, the playback device 110a is a coordinator of a group and is configured to transmit and receive timing information from one or more other devices in the group. The other one or more devices in the group can receive the selected media content from the computing device 106a, and begin playback of the selected media content in response to a message from the playback device 110a such that all of the devices in the group play back the selected media content in synchrony.

IV. Example Operations & Capabilities Utilizing a Maximum Volume Feature a. Example Operations of Playback Devices As touched on above, the playback devices 110a-110n in media playback system 100 maintain in their respective memories (e.g., the memory 112c of FIG. 1C) certain state variables. Generally, these state variables describe the state of the playback device(s), the playback zone(s), and/or a zone group associated therewith. And from time to time, one or more of these state variables are updated. One such state variable is referred to as a "playback volume" state variable. Typically, each given playback device 110a-110n in media playback system 100 will maintain its own playback volume state variable and, in operation, will render and output amplified audio signals at a volume level defined by its playback volume state variable.

In a typical configuration, a playback device stores the playback volume state variable as a number ranging from 0 to 100, with 0 representing no audible sound and 100 representing the loudest volume at which the playback device is designed to output audio signals. In operation according to this typical configuration, when a playback device's playback volume state variable is set to, for example, 75, the playback device will render and output amplified audio signals at a volume level that is about 75% of the loudest volume at which the playback device is designed to output audio signals. However, other configurations are possible in which a playback device maintains a playback volume state variable as a number in other ranges, such as from −100 to 100, with −100 representing no audible sound and 100 representing the loudest volume at which the playback device is designed to output audio signals, or from 0 to 500, with 0 representing no audible sound and 500 representing the loudest volume at which the playback device is able to output audio signals, among other example ranges.

In any case, as also mentioned above, a playback device generally shares certain of its state variables, including its playback volume state variable, among at least a portion of the other devices of the media playback system 100, so that one or more of the other devices have the most recent data associated with the media playback system 100. In some configurations, the playback device shares certain of its state variables during predetermined intervals of time (e.g., every 5 seconds, every 10 seconds, every 60 seconds). In other (additional or alternative) configurations, the playback device shares certain of its state variables in response to a query from another device to do so, or in response to a modification to one or more of its state variables.

In a typical configuration, a playback device adjusts its playback volume state variable, and thereby adjusts the volume level at which the playback device renders and outputs amplified audio signals, when it receives an instruction to do so. The playback devices 110a-110n of media playback system 100 are able to receive such instructions in different ways. In one example, a playback device receives an instruction to change its playback volume state variable via a user interface of the playback device (e.g. via user interface 113). For instance, as described with respect to playback device 110a, user interface 113 may include one or more buttons, knobs, dials, touch-sensitive surfaces, displays, and/or touchscreens. Accordingly, in this example, a user provides a request to change the volume of playback device 110a by pushing a designated volume-up or volume-down button or by tapping a designated volume-up or volume-down touch-sensitive surface. When playback device 110a, and specifically electronics 112, receives the request to change the volume, playback device 110a responsively increases or decreases the playback volume state variable, as the case may be.

In another example, the playback device 110a receives an instruction to change its playback volume from a controller device (e.g., controller device 130a). In this example, the controller device 130a sends via the network interface 132d an instruction to change the volume level of the playback device 110a to a particular level (e.g., volume level 30). Accordingly, the playback device 110a, and specifically electronics 112, receives the instruction to change the volume level of the playback device and responsively sets the playback volume state variable to the level specified in the received instruction (e.g., volume level 30).

Disclosed herein are alternate ways of adjusting the playback volume of one or more playback devices 110a-110n in media playback system 100. Generally, these alternate ways of adjusting playback volume utilize a maximum volume feature, whereby when a playback device receives an instruction to change its playback volume to a requested volume level, the playback device will not necessarily set its playback volume state variable to the requested volume level. Rather, the playback device will calculate a new (typically lower) alternate volume level and instead set its playback volume state variable to that alternate volume level. Further, when a playback device shares certain of its state variables among at least a portion of the other devices of the media playback system 100, the playback device will not necessarily share its playback volume state variable, but rather will calculate a new (typically higher) representative volume level and instead share that representative volume level.

More specifically, but still by way of example, in some embodiments a playback device (e.g., playback device 110a) maintains in its memory (e.g., memory 112c) an additional state variable referred to as a "maximum volume" state variable. In other embodiments, a maximum volume variable is additionally or alternatively maintained on another device, such as one or more of the remote computing devices 106a-106c. In some configurations, the maximum volume state variable is expressed as a percentage value ranging from 0% to 100% (or 0.0 to 1.0). However, other configurations are possible in which the maximum volume state variable is expressed in other forms, such as a number ranging from −100 to 100, or from 0 to 500, for instance.

In any case, when a playback device is operating in accordance with the maximum volume feature and receives an instruction to change its volume level, the playback device will, in some embodiments, refer to the maximum volume state variable and calculate an alternate volume level to use based on the maximum volume state variable. In some embodiments, the playback device calculates the alternate volume level in accordance with the following example rule:

$$\text{alternate volume level} = \text{requested volume level} * \text{maximum volume (\%)}$$

As set forth, the example rule specifies that to calculate an alternate volume level, the playback device will multiply the requested volume level by the maximum volume state variable specified as a percentage. To illustrate, FIG. 2 depicts an example scenario in which controller device 230a is communicatively coupled to playback device 110e via wireless link 203. In this scenario, controller device 230a sends via wireless link 203 an instruction to set the playback volume for playback device 110e to 50. In this scenario, and in accordance with one embodiment, playback device 110e receives the instruction, refers to its maximum volume state variable, which in this example is 70% (or 0.7) and multiplies 50 by 70% (or 0.7) to arrive at an alternate volume level of 35. Responsively, playback device 110e sets its playback volume state variable to this alternate volume level, and thereby renders and outputs amplified audio signals at a volume level defined by the playback volume state variable.

Other implementations are possible in which the maximum volume state variable is expressed in other forms. For instance, in one implementation, the maximum volume state variable is expressed in the form of a number from 0 to 500. In this implementation, the playback device will use the example rule set forth above but will first express the maximum volume state variable as a percentage. For example, in a scenario in which the maximum volume state variable is 350 and is expressed as a number from 0 to 500, then the playback device will use 350 divided by 500 (or 70%) as the maximum volume in the example rule set forth above. If the playback device receives an instruction to change its volume level to, say, volume level 50, then, like the previous scenario, the playback device will multiply 50 by 70% (which is 350/500 or 0.7) to arrive at an alternate volume level of 35.

As mentioned above, from time to time, playback devices of the media playback system 100 generally share certain of their state variables, including their playback volume state variables, among at least a portion of the other devices of the media playback system 100. In this way, the other devices (including controller devices) have the most recent data associated with the media playback system 100. As also mentioned above, in some embodiments of the present disclosure, when a playback device shares certain of its state variables among at least a portion of the other devices of the media playback system 100, the playback device will not necessarily share its playback volume state variable, but rather will calculate a new (typically higher) representative volume level and instead share that representative volume level.

In one particular embodiment, for instance, a playback device refers to the maximum volume state variable and calculates a representative volume level in accordance with the following example rule:

$$\text{representative volume level} = \frac{\text{current volume level}}{\text{maximum volume (\%)}}$$

As set forth, the example rule specifies that to calculate a representative volume level, the playback device will divide the current playback volume level by the maximum volume state variable specified as a percentage. To illustrate, FIG. 3 depicts an example scenario in which controller device 330a is communicatively coupled to playback device 110e via wireless link 303. In this scenario, playback device 110e's current playback volume level is, say, 35 and its maximum volume state variable is 70% (or 0.7). In this scenario, and in accordance with one embodiment, playback device will divide 35 by 70% (or 0.7) to arrive at a representative volume level of 50. Playback device 110e then shares with the other devices in media playback system 100 (e.g., controller device 330a) an indication of this representative level of 50 instead of its actual playback volume level of 35. Additional details regarding the representative volume level calculation are described below with reference to FIGS. 7A-D.

Figure 9:
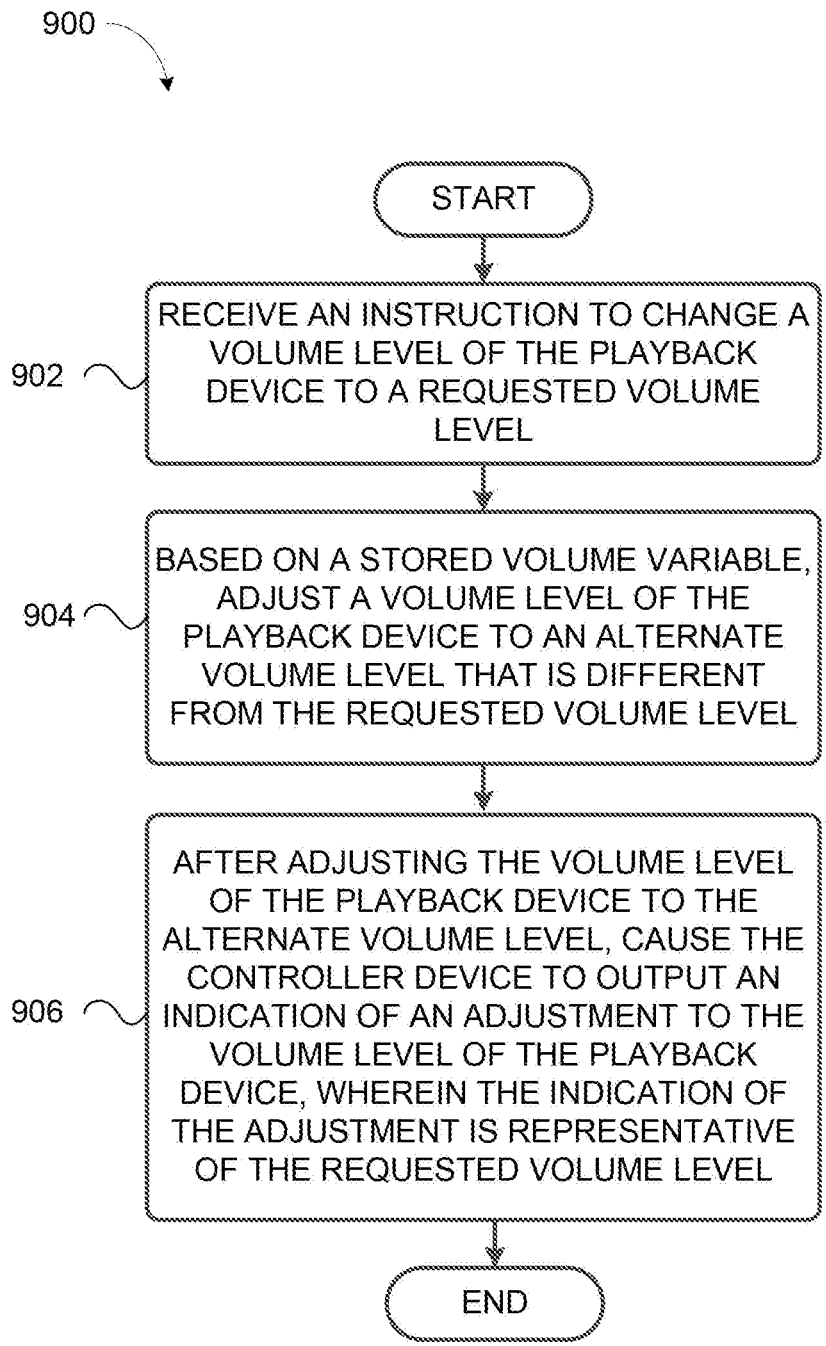
FIG. 9 is a flow diagram of an example method for adjusting the playback volume of a playback device in accordance with aspects of the disclosed technology.

For purposes of illustration, FIG. 9 depicts an example flow diagram 900 for adjusting the playback volume of a playback device. It should be understood that the flow diagram 900 is exemplary. For instance, one or more blocks shown in the flow diagram 900 of FIG. 9 may be rearranged into different orders, combined into fewer blocks, separated into additional blocks, and/or removed altogether. It should further be understood that the method depicted in flow diagram 900 could be performed by a device other than a playback device of the media playback system 100, which may be part of a different type of system.

Turning first to block 902 of the flow diagram 900, at block 902, the playback device receives an instruction to change a volume level of the playback device to a requested volume level. As mentioned, in one example of this, the playback device receives such an instruction from a controller device. At block 904, the playback device adjusts its playback volume level, based on a stored volume variable, to an alternate volume level that is different than the requested volume level. As mentioned above, in one example of this, the stored volume variable is a maximum volume state variable. And in one implementation, the playback device adjusts its playback volume to an alternate level by multiplying the requested volume level by the stored volume variable expressed as a percentage and setting the playback device's playback volume state variable to the calculated alternate level. In an example in which the requested volume level is 50 and the stored volume variable is 70% (or 0.7), the playback device multiplies 50 by 70% (or 0.7) to arrive at an alternate volume level of 35. Other examples are possible.

Finally, at block 906, the playback device, after adjusting the volume level of the playback device to the alternate level causes a controller device to output an indication of an adjustment to the volume level of the playback device, where the adjustment is representative of the requested volume level. As mentioned, in one example of this the playback device causes a controller device to output an indication of an adjustment to the volume level of the playback device by dividing the playback volume of the playback device (which, according to block 904, is the alternate volume level) by the stored volume variable to arrive at a representative volume level and then transmitting this representative volume level to the controller device. In an example in which playback device's current volume level is 35 and the stored volume variable is 70% (or 0.7), the playback device divides 35 by 70% (or 0.7) to arrive at a representative volume level of 50, which the playback device transmits to the controller device. Responsive to receiving from the playback device this representative volume level, the controller device outputs an indication that the playback device is operating at the representative volume level. Other examples are possible.

In some embodiments, a playback device will utilize multiple maximum volume state variables, where each maximum volume state variable is a source-specific maximum volume state variable. In operation according to these embodiments, the playback device will adjust its playback volume based on a particular one of these source-specific maximum volume state variables depending on which the media content source the playback device is currently using.

To illustrate, consider an example scenario in which a playback device utilizes two source-specific maximum volume variables: a first source-specific maximum volume variable of 70% for use with Internet-based music streaming services (e.g., Spotify, Radio by Tunein, Apple Music, Pandora, Amazon, etc.) and a second source-specific maximum volume variable of 50% for use with all other media content sources (e.g., TV, local music, line-in, etc.). In accordance with this example, when the playback device receives an instruction to adjust its playback volume to, say, a volume level of 90, the playback device will first determine which media content source the playback device is currently using. If the playback device determines that it is using an Internet-based music streaming service (e.g., Spotify) for instance, then the playback device will adjust its playback volume using the first source-specific maximum volume variable. As such, the playback device will multiply 90 by 70% (or 0.7) to arrive at an alternate volume level of 63 and thereafter set is playback volume to this alternate level of 63. If, in the alternative, the playback device determines that it is using a media content source other than an Internet-based music streaming service, then the playback device will adjust its playback volume using the second source-specific maximum volume variable. As such, the playback device will multiply 90 by 50% (or 0.5) to arrive at an alternate volume level of 45 thereafter set is playback volume to this alternate level of 45.

In other examples, the source-specific maximum volume variables can be utilized at varying levels of granularity. For example, a playback device may utilize a first source-specific maximum volume variable (e.g., 90%) for one specific type of Internet-based music streaming service (e.g., Spotify) and a second source-specific maximum volume variable (e.g., 35%) for another type of Internet-based music streaming service (e.g., Pandora). Other examples are also possible.

b. Example Operations of Bonded & Grouped Playback Devices

As described above with respect to FIGS. 1I-1M, playback devices may be configured for operating in what were referred to as "bonded" or "grouped" configurations. In some implementations of this, for instance, playback devices are configured to be arranged into a "bonded" set of two or more playback devices, which thus forms a single zone. By way of example, FIG. 1I depicts a stereo pair of playback devices 110*l* and 110*m* forming "Master Bedroom" zone 101*b*; FIG. 1J depicts a bonded set of playback devices 110*h* and 110*i* forming "Den" zone 101*c*; and FIG. 1K depicts that same "Den" zone 101*c* where the bonded set of playback devices 110*h* and 110*i* include two additional playback devices 110*j* and 110*k*. In other implementations of this, zones of individual or bonded playback devices may be grouped to form what were referred to as a zone group. By way of example, FIG. 1L depicts a "Kitchen+Dining" zone group comprising the "Kitchen" zone 101*h* (which includes playback device 110*b*) and the "Dining" zone 101*g* (which includes playback device 101*g*). When grouped, the zones of individual and/or bonded playback devices may play back audio in synchrony with one another, as described in previously-referenced U.S. Pat. No. 8,234,395.

In some embodiments of the present disclosure, playback devices operating in a bonded or a grouped configuration are configured to utilize one or more maximum volume state variables. In one particular embodiment, for instance, all playback devices arranged into a bonded set utilize a common maximum volume state variable. In this embodiment, when the playback devices of the bonded set receive an instruction to adjust their playback volume, each playback device adjusts its playback volume in accordance with the common maximum volume state variable. This can be carried out in one of a few different ways, depending on the implementation.

As a general matter, volume control for playback devices arranged into bonded sets generally takes place with a controller device transmitting a volume adjustment instruction to a particular one of the playback devices of the bonded set (where this playback device is referred to as the "primary" playback device in the bonded set), and that playback device then relaying the volume adjustment instruction to the remaining device(s) in the bonded set (where this remaining device(s) is referred to as the "secondary" playback device(s) in the bonded set). Thus, in one implementation of the maximum volume feature for playback devices arranged into a bonded set, when the primary playback device receives an instruction to adjust the playback volume of the bonded set, the primary playback device refers to the common maximum volume state variable and calculates an alternate volume level to use based on the maximum volume state variable. The primary playback device then sets its playback volume state variable to this alternate level and transmits an instruction to the secondary playback device (or devices) to set its respective playback volume state variable to this alternate level as well.

Likewise, a volume adjustment instruction for playback devices arranged in a bonded set may be received via a button or a touch-sensitive surface on a particular playback device of the playback devices in the bonded set. The volume adjustment instruction is then transmitted from the particular playback device to the primary playback device, from which the alternate volume level is calculated and relayed to the secondary playback device (or devices) in the bonded set.

Using the arrangement depicted in FIG. 1K as an example, in a scenario in which the common maximum volume state variable for the "Den" zone 101*c* is, say, 70%, when the primary playback device (e.g., playback device 110*h*) receives an instruction to change the volume level for the zone to, say, volume level 50, the primary playback device will multiply 50 by 70% (or 0.7) to arrive at an alternate volume level of 35. The primary playback device 110*h* then sets its playback volume state variable to this alternate level of 35 and transmits to the remaining playback devices in the bonded set (which in this example scenario are playback devices 110*j*, 110*i*, and 110*k*) instructions to set their respective playback volumes to this alternate level of 35.

In an alternative implementation of the maximum volume feature for playback devices arranged into a bonded set, when the primary playback device receives an instruction to adjust the playback volume of the bonded set, the primary playback device relays the instruction to adjust the playback volume of the bonded set to each secondary device in the bonded set. The primary playback device and the secondary playback device(s) then, individually refer to the common maximum volume state variable and, individually, calculate an alternate volume level to use based on the common maximum volume state variable. Each playback device in the bonded set then sets its playback volume state variable to this alternate level.

Referring again to the example arrangement depicted in FIG. 1K as an example, in a scenario in which the common maximum volume state variable for the "Den" zone 101*c* is, say, 70%, when the primary playback device (e.g., playback device 110*h*) receives an instruction to change the volume level for the zone to, say, volume level 50, the primary playback device will relay this instruction to the remaining playback devices in the bonded set (which in this example scenario are playback devices 110*j*, 110*i*, and 110*k*). Each playback device in the bonded set will then refer to the common maximum volume state variable (e.g., 70%) and multiply 50 by 70% (or 0.7) to arrive at an alternate volume level of 35. Each playback device then sets its respective playback volume state variable to this alternate level of 35.

In another implementation, playback devices arranged into a bonded set utilize multiple, perhaps different, maximum volume state variables. In a home theater arrangement, for instance, it may be desirable to utilize one maximum volume state variable for, say, the Front and Sub playback devices, and another, perhaps different, maximum volume state variable for the Left and Right playback devices. Thus, in accordance with this implementation, playback devices arranged into a bonded set maintain their own, respective maximum volume state variables. As such, when the primary playback device receives an instruction to adjust the playback volume of the bonded set, the primary playback device relays the instruction to adjust the playback volume of the bonded set to each secondary device in the bonded set. Each playback device then refers to its own respective maximum volume state variable and calculates an alternate volume level to use based on the maximum volume state variable. Each individual playback device then sets its respective playback volume state variable to the respective alternate volume level calculated by the individual playback device. In one case, a single maximum volume state variable for each playback device in the home theater arrangement may be applied when the audio source is, e.g. TV or line-in, while different maximum volume state variables for the playback devices may be applied when the audio source is an Internet-based music streaming service.

Referring again to the arrangement depicted in FIG. 1K as an example, consider a scenario in which playback devices 110*h* and 110*i* maintain maximum volume state variables of, say, 70%, and playback devices 110*j* and 110*k* maintain maximum volume state variables of, say, 50%. If the primary playback device (e.g., playback device 110*h*) receives an instruction to change the volume level for the zone to, say, volume level 90, the primary playback device will relay this instruction to the remaining playback devices in the bonded set (which in this example scenario are playback devices 110*j*, 110*i*, and 110*k*). Each playback device in the bonded set will then refer to its own respective maximum volume state variables to calculate respective alternate volume levels. In this example, playback devices 110*h* and 110*i* will refer to their respective maximum volume state variables (e.g., 70%) and multiply 90 by 70% (or 0.7) to arrive at an alternate volume level of 63, whereas playback devices 110*j* and 110*k* will refer to their respective maximum volume state variables (e.g., 50%) and multiply 90 by 50% (or 0.5) to arrive at an alternate volume level of 45. Each playback device of the bonded set will then set its respective playback volume state variables to these respective calculated alternate volume levels.

In a similar embodiment, playback devices arranged into zone groups utilize zone-specific maximum volume state variables. Like volume control for playback devices arranged in bonded sets, volume control for playback devices arranged in zone groups typically takes place with a controller device transmitting a zone-specific volume adjustment instruction to a particular one of the playback devices of the zone group (where this playback device is referred to as the "group coordinator"), and that playback device then relaying the volume adjustment instruction to the remaining device(s) in the zone group (where these remaining devices are referred to as the "group members"). As such, when the group coordinator receives an instruction to adjust the playback volume of a particular zone in the zone group to a requested level, the group coordinator will relay this volume adjustment instruction to the group members of the particular zone. Each playback device in the particular zone will then refer to their zone-specific maximum volume state variables to calculate respective alternate volume levels to use.

For example, referring to FIG. 1L, playback device 110*b* maintains a first maximum volume state variable (e.g., 70%), whereas playback device 110*d* maintains a second maximum volume state variable (e.g., 50%). If the group coordinator playback device (e.g., playback device 110*b*) receives an instruction to change the volume level for the "Dining" zone 101*g* to, say, volume level 90, the group coordinator playback device (e.g., playback device 110*b*) will relay this instruction to the group member playback device 110*d*. Upon receiving this relayed instruction, group member playback device 110*d* will then refer to its own zone-specific respective maximum volume state variable to calculate a respective alternate volume level. In this example, playback device 110*d* will refer to its zone-specific maximum volume state variable (e.g., 50%) and multiply 90 by 50% (or 0.5) to arrive at an alternate volume level of 45. Playback device 110d then sets is playback volume state variable to 45.

In one case, the instruction to change the volume level for the "Dining" zone 101g to 90 may be an explicit instruction directed to the "Dining" zone 101g and playback device 110d. In another case, the instruction to change the volume level for the "Dining" zone 101g to 90 may be part of an instruction to change a group volume level of the zone group including both "Kitchen" zone 101h and "Dining" zone 101g, i.e. an average of volume levels of playback devices 110h and 110d in the zone group. In this case, additional calculations by the controller device and/or group coordinator playback device may be performed to determine the instruction to change the volume level for "Dining" room 101g to volume level 90, before the group coordinator playback device transmits the instruction to playback device 110d.

In some additional embodiments of the present disclosure, the media playback system 100 is configured to facilitate establishing dynamic zone groups with preconfigured settings, referred to as "zone scenes." For instance, a user can establish an "Evening" zone scene specifying that the "Living Room" zone 101f, "Dining Room" zone 101g, and "Kitchen" zone 101h are to be grouped together to form a zone group, and a "Morning" zone scene specifying that the "Master Bedroom" zone 101b, "Bathroom" zone 101a, and "Kitchen" zone 101h are to be grouped together to form a zone group. Further, each zone scene can specify certain preconfigured settings for the zones in the zone group. By way of example, the "Evening" zone scene may specify that all playback volume variables for the zones shall be set to volume level 20, whereas the "Morning" zone scene may specify that the "Bathroom" zone 101a and "Master Bedroom" zone 101b shall have playback volumes set to 35 but the "Kitchen" zone 101h shall have a playback volume set to 50. Other examples of preconfigured settings are possible, as are other examples of zone scene configurations. Additional details regarding zone scenes can be found, for example, in previously-referenced U.S. Pat. No. 8,483,853.

In some embodiments of the present disclosure, media playback system 100 is configured to facilitate establishing zone scenes with one or more preconfigured maximum volume variables. For instance, in the example "Evening" zone scene referenced above, a user might specify that the "Evening" zone scene should utilize a common maximum volume variable, of, say, 50, for the zone group. In this example, when the "Evening" zone scene is invoked, the playback devices comprising the "Living Room" zone 101f, "Dining Room" zone 101g, and "Kitchen" zone 101h (e.g., playback devices 110e, 110d, and 110b) will form a new zone group and will also establish respective maximum volume state variables of 50. Volume control for the zone group proceeds in accordance with the discussion above with respect to volume control for zone groups using a maximum volume state variable.

In another example, a user might specify that the "Evening" zone scene should utilize multiple different maximum volume variables. For instance, a user might specify that playback devices in the "Living Room" zone 101f and "Kitchen" zone 101h should use a maximum volume variable of 50, but playback devices in the "Dining Room" zone 101g should use a maximum volume variable of 25. In this example, when the "Evening" zone scene is invoked, the playback devices comprising the "Living Room" zone 101f, "Dining Room" zone 101g, and "Kitchen" zone 101h (e.g., playback devices 110e, 110d, and 110b) will form a new zone group with playback devices 110e and 110b establishing maximum volume state variables of 50 and playback device 110d establishing a maximum volume variable of 25. Volume control for the zone group proceeds in accordance with the discussion above with respect to volume control for zone groups using a maximum volume state variable.

In yet an alternative implementation, a user can establish a zone scene but not specify any preconfigured maximum volume variables. In this implementation, when the zone scene is invoked, each playback device forming the new zone group will utilize the maximum volume state variable that was in use at the time of invoking the zone scene. For instance, in the example "Evening" zone scene referenced above, a user might not specify any maximum volume level for the zone scene. In this case, when the "Evening" zone scene is invoked, the playback devices comprising the "Living Room" zone 101f, "Dining Room" zone 101g, and "Kitchen" zone 101h (e.g., playback devices 110e, 110d, and 110b) will form a new zone group but will not establish any new respective maximum volume state variables. If, say, prior to invocation of the zone scene, playback device 110e maintained a maximum volume state variable of 75, playback device 11d maintained a maximum volume state variable of 50, and playback device 110b maintained a maximum volume level of 100, then these playback devices would maintain these same maximum volume state variables upon invocation of the zone scene. Volume control for the zone group proceeds in accordance with the discussion above with respect to volume control for zone groups using a maximum volume state variable.

c. Example Operations of Controller Devices

Described below are example operations of controller devices according to one or more embodiments of the present disclosure. As set forth above, control devices that operate within media playback system 100, such as control devices 130a (FIG. 1H), 430 (FIGS. 4A-4D), and 530 (FIG. 5), are generally configured to present, via a user interface, certain operating parameters of the media playback system. These control devices are also generally configured to receive user input related to the media playback system 100 and, in response, cause one or more devices in the media playback system 100 to perform an action(s) or operation(s) corresponding to the user input.

In one specific aspect, these control devices are configured to present, via a user interface, the current volume level of one or more playback devices in the media playback system 100, as well as receive a user input that requests a change to the volume level of one or more playback devices of media playback system 100. Once such a user input is received at a control device, the control device is configured to send, over a network interface (e.g., network interface 132d) to the playback device, an instruction to change the volume level of the playback device to the volume level requested by the user.

In some embodiments of the present disclosure, and in accordance with the description set forth above, playback devices are configured such that when a playback device receives an instruction to change the volume level of the playback device to a requested level, the playback device will refer to a maximum volume state variable and calculate an alternative volume level to use instead of the requested volume level. In these embodiments, the playback device adjusts its volume level to this alternative volume level but sends back to the controller device an indication that the playback device is using the requested volume level. In response to receiving this indication, the controller device presents, via a user interface, an indication that the volume level for the playback device is the volume level requested by the user. Thus, the controller device represents, via the user interface, that the playback device is operating at the volume level requested by the user even though the playback device is actually operating at a different (typically lower) volume level.

Figure 7A:
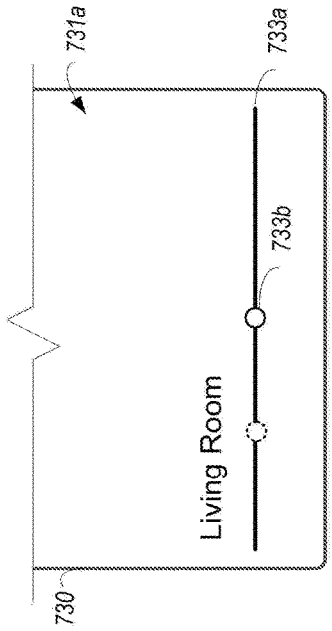
FIGS. 7A-7D are depictions of partial schematic diagrams of controller devices in operation with a playback device in accordance with aspects of the disclosed technology.

To illustrate, FIG. 7A depicts an example portion of a control device 730, which includes user interface 731a. In order to present certain operating parameters of the media playback system 100, the control device 730 receives from the playback devices of media playback system 100 an indication of the state variables of each playback device. In one implementation of this, the controller device 730 prompts the playback devices to share their state variables, by, for instance, issuing a state-variable query to each playback device. The playback devices in media playback system 100 respond to this query by transmitting their state variables to controller device 100, which in turn presents certain operating parameters of the media playback system 100, such as the volume level of each playback device. In another implementation, the playback devices transmit certain of their state variables to controller device 730 during predetermined intervals of time (e.g., every 5 seconds, every 10 seconds, every 60 seconds).

Figure 7B:
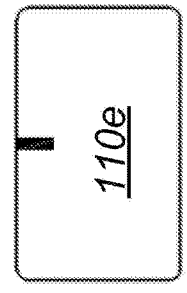

In line with the example described above, playback device 110e may receive a state-variable query from controller device 730. Responsively, playback device 110e retrieves certain state variables from storage and transmits indications of these state variables to controller 730. In one embodiment of the present disclosure, however, the playback device 110e does not transmit its playback volume state variable, but instead calculates a representative volume level and transmits this representative volume level to the controller device 730 as its playback volume state variable. To illustrate this, FIG. 7B depicts a scenario in which playback device 110e has a maximum volume state variable of 70% and a playback volume state variable of 17.5. In this example scenario, because playback device 110e is using a maximum volume state variable, playback device 110e does not transmit its current playback volume state variable of 17.5, but rather calculates a representative volume level in accordance with the example rule (also discussed above):

$$\text{representative volume level} = \frac{\text{current volume level}}{\text{maximum volume (\%)}}$$

As set forth, the example rule specifies that to calculate a representative volume level, the playback device will divide the current playback volume level by the maximum volume state variable specified as a percentage. In the example depicted in FIG. 7B, playback device 110e will divide 17.5 by 70% (or 0.7) to arrive at a representative volume level of 25. Once the playback device 110e calculates the representative volume level, playback device 110e sends an indication of the representative volume level to controller device 730, thereby representing to controller device 730 that the current playback volume level of playback device 110e is 25 when it is actually 17.5. Thus, when controller device 730 receives this indication, the controller device 730 presents via user interface 731a (as depicted in FIG. 7A) an indication that playback device 110e is operating with a current playback volume of 25, when it is actually operating with a current playback volume of 17.5. In one example implementation, controller device 730 does this by including within user interface 731a a volume meter 733a with volume slider 733b currently positioned at the 25% position. As depicted, user interface 731a, and more specifically volume slider 733a, is representing that the current playback volume level for the playback device in the "Living Room" zone (e.g., playback device 110e) is 25.

Figure 7C:
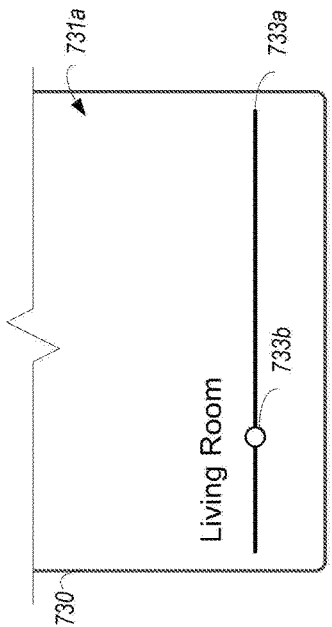

Controller device 730 may thereafter receive a user input requesting to change the volume level for playback device 110e. As depicted in FIG. 7C, for example, controller device 730 receives a user input that adjusts the volume slider 733b to a new position on the volume meter 733a, which in this example is the 50% position. As such, the controller 730 interprets this user input as a request to adjust the playback volume of the playback device in the "Living Room" zone (i.e., playback device 110e) to the requested level of 50. Responsively, controller device 730 transmits an instruction to playback device 110e to adjust its volume level to this requested volume level of 50.

Figure 7D:
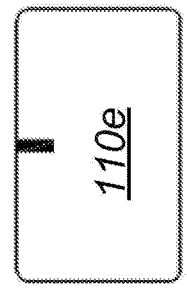

In one embodiment, playback device 110e receives the instruction to change its volume level to the requested level of 50, but because playback device 110e is using a maximum volume state variable, playback device 110e refers to this maximum volume state variable and calculates a new alternate volume level to use instead of the requested volume level of 50. More particularly, and in line with the discussion above, when playback device 110e receives an instruction to set its playback volume to the requested volume level of 50, playback device 110e uses the example rule (set forth above) and multiplies the requested volume level (which in this example is 50) by the maximum volume state variable specified as a percentage (which in this example is 70%) to arrive at an alternate volume level of 35. In accordance with this embodiment, and as depicted in FIG. 7D, playback device 110e sets its playback volume state variable to 35 instead of the requested level of 50.

Despite playback device 110e setting its current volume state variable to 35 rather than the requested volume level of 50, controller device 730, in this embodiment, nonetheless presents an indication, via user interface 731a and more specifically volume slider 733a, that the playback volume level of playback device 110e is 50. For instance, in one embodiment, after playback device 110e adjusts its playback volume to the alternate volume level of 35, playback device 110e will send an indication back to the controller device 730 that playback device 110e is using the requested volume level of 50. Thus, controller device 730 presents via user interface 731a and more specifically volume meter 733a (as depicted in FIG. 7C), an indication that playback device 110e is operating with a current playback volume of 50, when it is actually operating with a current playback volume of 35.

Figure 10:
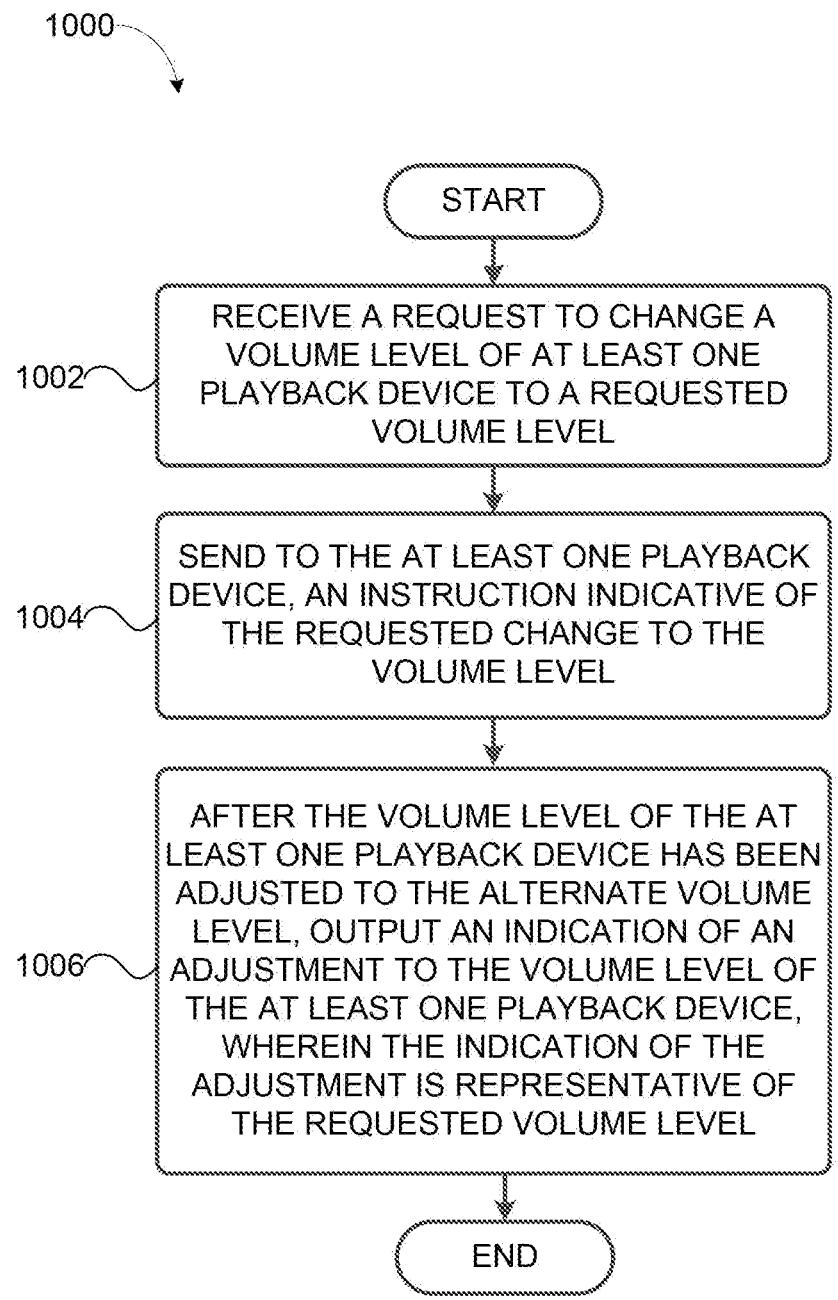
FIG. 10 is a flow diagram of an example method for receiving a request to adjust the volume level of a playback device and outputting an indication of the playback volume adjustment in accordance with aspects of the disclosed technology.

For purposes of illustration, FIG. 10 depicts an example flow diagram 1000 for receiving a request to adjust the volume level of a playback device and outputting an indication of the playback volume adjustment. As with flow diagram 900 (FIG. 9), it should be understood that the flow diagram 1000 is exemplary. For instance, one or more blocks shown in the flow diagram 1000 of FIG. 10 may be rearranged into different orders, combined into fewer blocks, separated into additional blocks, and/or removed altogether. It should further be understood that the method depicted in flow diagram 1000 could be performed by a device other than a controller of the media playback system 100, which may be part of a different type of system.

Turning first to block 1002 of the flow diagram 1000, at block 1002, a controller device receives a request to change a volume level of at least one playback device to a requested volume level. As mentioned, in one example of this, the controller device receives such a request when it receives a user input requesting to change the volume level of at least one playback device to a requested level, such as by receiving a user input adjusting a volume slider presented on a user interface. At block 904, the controller device sends to the at least one playback device an instruction to change the volume level of the at least one playback device to the requested level. For instance, if the controller device receives a request to change the volume level of a playback device to level 50, then the controller device will send an instruction to the playback device instructing the playback device to change its playback volume level to volume level 50. As further mentioned above, in some embodiments, this instruction causes the playback device to adjust its playback volume to an alternate level, rather then the requested volume level. In one example of this, the controller device sends an instruction to change the volume level of the playback device to a requested level 50, but rather than setting its playback volume level to the requested level 50, the playback device refers to a stored volume variable of, say, 70% and multiplies the requested volume level (50) by the stored volume variable (70%, or 0.7) to arrive at an alternate volume level of 35. The playback device then sets its playback volume to this alternate level rather than the requested level. Other examples are possible.

Finally, at block 1006, after the volume level of the playback device has been adjusted to the alternate level, the controller device outputs an indication of an adjustment to the volume level of the playback device, where this indication is representative of the requested volume level. As mentioned, in one example of this, the playback device divides its playback volume by the stored volume variable to arrive at a representative volume level and then transmits this representative volume level to the controller device. In an example in which playback device's current volume level is 35 and the stored volume variable is 70% (or 0.7), the playback device divides 35 by 70% (or 0.7) to arrive at a representative volume level of 50, which the playback device transmits to the controller device. Responsive to receiving from the playback device this representative volume level, the controller device outputs an indication that the playback device is operating at the representative volume level even though the playback device is operating at the alternate volume level. This representative volume level is representative of the requested volume level received by the controller at block 1002 and sent in an instruction to the playback device at block 1004. Other examples are possible.

In some embodiments, controller devices are configured to facilitate establishing and adjusting a maximum volume state variable for one or more playback devices in media playback system 100. To illustrate an example embodiment of establishing and adjusting a maximum volume state variable for playback device 110e, FIGS. 8A-E depict example user interfaces 831a-831e that are configured for presentation on a controller device (e.g., one or more of control devices 130a (FIG. 1H), 430 (FIGS. 4A-4D), and 530 (FIG. 5)). As depicted in FIG. 8A, user interface 831a presents a home-settings screen that includes multiple areas configured for receiving a touch input to request additional sub-settings screens. For example, if a user selects the "Room Settings" area 833a, the controller device is configured to present the additional user interface 831b depicted in FIG. 8B. As depicted, user interface 831b presents a "Room Settings" selection screen that includes multiple areas configured for receiving a touch input to request additional settings screens for each individual zone in the media playback system 100. For example, if a user selects the "Living Room" area 833b, the controller device is configured to present a "Living Room" settings screen 831c depicted in FIG. 8C.

As depicted, user interface 831c presents several areas configured for receiving touch inputs to establish or adjust settings for the "Living Room" zone. Among others, "Living Room" settings screen 831c includes a "Volume Limit" area 833c configured for receiving a touch input in order to access a screen from which the user can establish or adjust the maximum volume setting for the Living Room zone. For example, if a user selects the "Volume Limit" area 833c, the controller device is configured to present a "Volume Limit" screen 831d depicted in FIG. 8D. As depicted, user interface 831d presents a "Volume Limit" screen that includes a volume slider 833d, which is configured for receiving touch inputs in order to establish or adjust the maximum volume state variable for the Living Room zone.

As further depicted in FIG. 8D, the volume slider 833d is positioned at 100%, which indicates that no maximum volume variable is in use (or, alternatively, that a maximum volume variable of 100 is in use, which has the same effect as operating as though no maximum volume variable is in use). However, user interface 831d is configured so that a user can adjust the slider 833d in order to establish a maximum volume state variable for the Living Room zone. For example, if the user adjusts the slider 833d to the 75% position, as depicted by the slider 833e in FIG. 8E, then the controller device is configured to transmit an instruction to the playback device(s) that comprise the Living Room zone (e.g., playback device 110e) that causes the playback device(s) to set a maximum volume state variable of 75%. Accordingly, when a playback device receives an instruction to set a maximum volume variable, the playback device will set a maximum volume state variable accordingly, and thereafter carry out volume adjustments in accordance with the discussion set forth herein. Additional adjustments to the volume slider 833e will cause the controller device to issue respective instructions to change the maximum volume state variable accordingly.

Figure 8F:
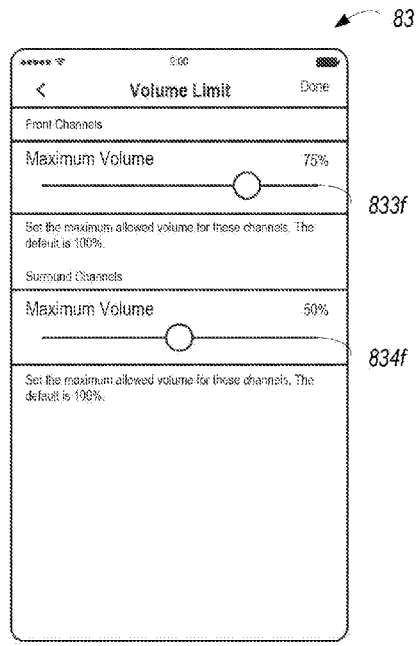

In embodiments in which a bonded set utilizes multiple maximum volume state variables (such as the Home Theater example described above in which the Front and Sub playback devices use a first maximum volume state variable and the Right and Left playback devices use a second maximum volume state variable), controller devices are configured for presenting a particular user interface to facilities establishing and adjusting these multiple maximum volume state variables. For example, FIG. 8F depicts an example user interface 831f, which as depicted presents two volume sliders 833f and 834f configured for receiving touch inputs in order to establish or adjust the multiple maximum volume state variables for the bonded set. In particular, slider 833f is configured for receiving a touch input to set or adjust the maximum volume state variable for the front channels of the bonded set (which in the example depicted in FIG. 1K are playback devices 110h and 110i), and slider 834f is configured for receiving a touch input to set or adjust the maximum volume state variable for the surround channels of the bonded set (which in the example depicted in FIG. 1K are playback devices 110j and 110k).

For example, if a user adjusts slider 833f to the 75% position, and the slider 834f to the 50% position, as depicted in FIG. 8F, then the controller device is configured to transmit respective instructions to the playback devices in the bonded set (e.g., playback device 110h-k) that cause the playback devices to set maximum volume state variables of 75% and 50%, respectively. Specifically, as depicted in FIG.

8F, controller device 833*f* is configured to transmit instructions to playback devices 110*h* and 110*i* to cause playback devices 110*h* and 110*i* to set respective maximum volume state variables of 75%, and to transmit instructions to playback devices 110*j* and 110*k* to cause playback devices 110*j* and 110*k* to set respective maximum volume state variables of 50%. Additional adjustments to volume slider 833*f* or 834*f* will cause the controller device to issue corresponding respective instructions to change the maximum volume state variables of the playback devices accordingly.

Figures 8G, 8H:
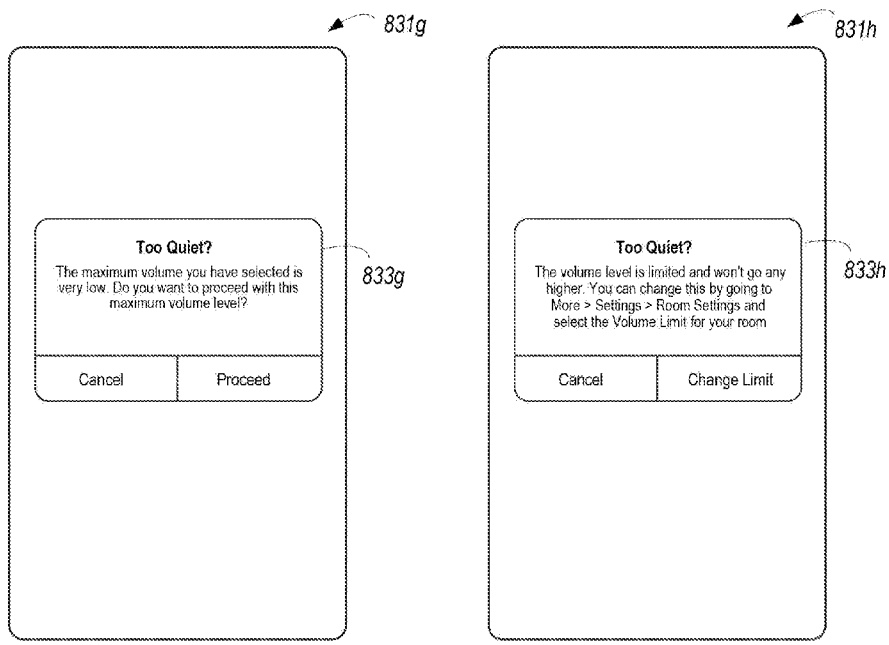

In some embodiments, the controller device is configured to present a warning screen if the controller device receives a user input requesting an excessively low maximum volume setting. For instance, if a user adjusts the maximum volume slider to a position that is at or below the 10% position, the controller may be configured to present user interface 831*g* containing warning screen 833*g*, as depicted in FIG. 8G. Warning screen 833*g* affords the user the opportunity to cancel the maximum volume adjustment or to proceed with the maximum volume adjustment.

Further, in some embodiments, the controller device is configured to present a shortcut screen in response to receiving certain types of volume adjustment requests. For instance, in one implementation, the controller device is configured to present shortcut screen 831*h* including shortcut prompt 833*h* if the controller device receives a request to adjust the volume level of a playback device to at (or near) 100% when that playback device is using a maximum volume setting.

In another implementation, the controller device is configured to present shortcut screen 831*h* including shortcut prompt 833*h* if the controller device receives a request to increase the volume level of a playback device when that playback device is using a maximum volume setting and the controller is representing that the volume level of the playback device is at (or near) 100%. For example, when a controller presents an indication (via a volume solider, for instance) that a playback device is operating with a volume level at (or near) 100% and the controller receives a request to further increase the volume level of the playback device (e.g., by identifying an attempt to adjust the slider past the 100% position, or by identifying a respective volume-up button press on the controller, or the like), the controller may responsively present shortcut screen 831*h* including shortcut prompt 833*h*.

V. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A controller device of a media playback system, the controller device comprising:
   a network interface configured to communicatively couple the controller device to at least one playback device of the media playback system;
   an input interface;
   at least one processor;
   a non-transitory computer-readable medium having instructions stored thereon, wherein the instructions, when executed by the at least one processor, cause the controller device to:
      receive, via the input interface, a request to change a volume level of the at least one playback device to a requested volume level;
      send, via the network interface to the at least one playback device, an instruction indicative of the requested change to the volume level, wherein sending the instruction causes the at least one playback device to adjust a volume level of the at least one playback device to a first adapted volume level that is lower than the requested volume level; and
      after the volume level of the at least one playback device has been adjusted to the first adapted volume level, output an indication of an adjustment to the volume level of the at least one playback device, wherein the indication of the adjustment is representative of the requested volume level.

2. The controller device of claim 1, wherein the instructions, when executed by the at least one processor, further cause the playback device to:
   receive, via the input interface, a request to set a desired maximum volume level for the at least one playback device; and
   in response to receiving the request to set the desired maximum volume level, sending via the network interface to the at least one playback device, an instruction to set the desired maximum volume level as a stored volume variable for the at least one playback device, wherein the first adapted volume level is defined using the stored volume variable.

3. The controller device of claim 1, wherein the instructions, when executed by the at least one processor, further cause the playback device to:
   receive, via the input interface, a request to set a desired source-specific maximum volume level for the at least one playback device to use when the at least one playback device is playing back media from a specific source; and
   in response to receiving the request to set the desired source-specific maximum volume level, sending via the network interface to the at least one playback device, an instruction to set the desired source-specific maximum volume level as a stored volume variable for the at least one playback device to use when the at least one playback device is playing back media from the specific source, wherein the first adapted volume level is defined using the stored volume variable.

4. The controller device of claim 1, wherein the instructions, when executed by the at least one processor, further cause the playback device to:
   query the at least one playback device, via the network interface, for the volume level of the at least one playback device;
   in response to the querying, receive from the at least one playback device, via the network interface, a reported volume level than is different from the volume level of the at least one playback device; and
   representing, via an output, that the volume level of the at least one playback device is the reported volume level.

5. The controller device of claim 1,
   wherein the at least one playback device includes at least a first playback device and a second playback device, the first playback device and the second playback device being configured to play back media in synchrony,
   wherein the instructions, when executed by the at least one processor, further cause the playback device to:
      receive, via the input interface, a request to change a volume level for the first playback device and the second playback device to a second requested volume level;
      send, via the network interface to at least one of the first playback device and the second playback device, an instruction indicative of the requested change to the volume level for the first playback device and the second playback device, wherein sending the instruction causes (i) the first playback device to adjust a volume level of the first playback device to a second adapted volume level, and (ii) the second playback device to adjust a volume level of the second playback device to the second adapted volume level, the second adapted volume level being lower than the second requested volume level;
      after the respective volume levels of the first playback device and the second playback device have been adjusted to the second adapted volume level, output an indication of an adjustment to the volume level for the first playback device and the second playback device, wherein the indication of the adjustment is representative of the second requested volume level.

6. The controller device of claim 1,
   wherein the at least one playback device includes at least a first playback device and a second playback device, the first playback device and the second playback device being configured to play back media in synchrony,
   wherein the instructions, when executed by the at least one processor, further cause the playback device to:
      receive, via the input interface, a request to change a volume level for the first playback device and the second playback device to a second requested volume level;
      send, via the network interface to at least one of the first playback device and the second playback device, an instruction indicative of the requested change to the volume level for the first playback device and the second playback device, wherein sending the instruction causes (i) the first playback device to adjust a volume level of the first playback device to a second adapted volume level, and (ii) the second playback device to adjust a volume level of the second playback device to a third adapted volume level, the second adapted volume level, third adapted volume level, and the second requested volume level being different from one another;
      after the respective volume levels of the first playback device and the second playback device have been adjusted, output an indication of an adjustment to the volume level for the first playback device and the second playback device, wherein the indication of the adjustment is representative of the second requested volume level.

7. A playback device of a media playback system, the playback device comprising:
   a network interface configured to communicatively couple the playback device to, via a local communication network, (i) at least one additional playback device of the media playback system and (ii) a controller device;
   at least one processor; and
   a tangible, non-transitory computer-readable medium having instructions stored thereon, wherein the instructions, when executed by the at least one processor, cause the playback device to:
      receive, from the controller device via the network interface, an instruction to change a volume level of the playback device to a requested volume level;
      based on a stored volume variable, adjust a volume level of the playback device to an adapted volume level that is lower than the requested volume level; and
      after adjusting the volume level of the playback device to the adapted volume level, cause, via the network interface, the controller device to output an indication of an adjustment to the volume level of the playback device, wherein the indication of the adjustment is representative of the requested volume level.

8. The playback device of claim 7, wherein adjusting the volume level of the playback device to the adapted volume level that is lower than the requested volume level comprises:

adjusting, using the stored volume variable as a percentage from 0%-100%, the volume level of the playback device to be a product of the requested volume level and the stored volume variable.

9. The playback device of claim 7, wherein the instructions, when executed by the at least one processor, further cause the playback device to:

receiving, from the controller device via the network interface, an instruction to set the stored volume variable, the instruction being indicative of a desired maximum volume level for the playback device.

10. The playback device of claim 7, wherein the instructions, when executed by the at least one processor, further cause the playback device to:

prior to adjusting the volume level of the playback device, retrieve from a remote computing system the stored volume variable.

11. The playback device of claim 7, wherein causing, via the network interface, the controller device to output an indication of an adjustment to the volume level of the playback device comprises:

determining, using the stored volume variable as a percentage from 0%-100%, a representative volume level to be the volume level of the playback device divided by the stored volume variable; and sending, to the controller device via the network interface, an indication of the representative volume level.

12. The playback device of claim 7, wherein the stored volume variable is a source-specific maximum volume level, and wherein adjusting the volume level of the playback device to the adapted volume level that is lower than the requested volume level comprises:

determining that the playback device is currently configured to play back media from a specific media source; and in response to the determining, adjusting the volume level of the playback device to the adapted volume level, based on the source-specific maximum volume level, that is lower than the requested volume level.

13. A non-transitory computer-readable medium (CRM) having instructions stored thereon, wherein the instructions, when executed by one or more processors, cause a playback device of a media playback system to:

receive an instruction to change a volume level of the playback device to a requested volume level;

based on a stored volume variable, adjust a volume level of the playback device to an adapted volume level that is lower than the requested volume level; and after adjusting the volume level of the playback device to the adapted volume level, cause a controller device to output an indication of an adjustment to the volume level of the playback device, wherein the indication of the adjustment is representative of the requested volume level.

14. The CRM of claim 13, wherein adjusting the volume level of the playback device to the adapted volume level that is lower than the requested volume level comprises:

adjusting, using the stored volume variable as a percentage from 0%-100%, the volume level of the playback device to be a product of the requested volume level and the stored volume variable.

15. The CRM of claim 13, wherein the instructions, when executed by the at least one processor, further cause the playback device to:

receiving an instruction to set the stored volume variable, the instruction being indicative of a desired maximum volume level for the playback device.

16. The CRM of claim 13, wherein the instructions, when executed by the at least one processor, further cause the playback device to:

prior to adjusting the volume level of the playback device, retrieve from a remote computing system the stored volume variable.

17. The CRM of claim 13, wherein causing the controller device to output the indication of the adjustment to the volume level of the playback device comprises:

determining, using the stored volume variable as a percentage from 0%-100%, a representative volume level to be the volume level of the playback device divided by the stored volume variable; and sending, to the controller device an indication of the representative volume level.

18. The CRM of claim 13, wherein the stored volume variable is a source-specific maximum volume level, wherein the adapted volume level is defined using the source-specific maximum volume level, and wherein adjusting the volume level of the playback device to the adapted volume level that is lower than the requested volume level comprises:

determining that the playback device is currently configured to play back media from a specific media source; and in response to the determining, adjusting the volume level of the playback device to the adapted volume level, based on the source-specific maximum volume level, that is lower than the requested volume level.

* * * * *